United States Patent
Muramatsu et al.

(10) Patent No.: US 7,382,302 B2
(45) Date of Patent: Jun. 3, 2008

(54) A/D CONVERTER WITH VOLTAGE GENERATION CIRCUITS

(75) Inventors: Tomo Muramatsu, Tokyo (JP); Hirotomo Ishii, Kamakura (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 11/494,763

(22) Filed: Jul. 28, 2006

(65) Prior Publication Data

US 2007/0030191 A1 Feb. 8, 2007

(30) Foreign Application Priority Data

Jul. 28, 2005 (JP) ............... 2005-219430

(51) Int. Cl.
*H03M 1/12* (2006.01)

(52) U.S. Cl. ............. 341/155; 341/156; 341/158; 341/161; 341/162; 341/163; 341/164; 341/172

(58) Field of Classification Search ......... 341/161–164
See application file for complete search history.

(56) References Cited

U.S. PATENT DOCUMENTS

| | | | |
|---|---|---|---|
| 4,983,974 A * | 1/1991 | Mijuskovic | 341/156 |
| 6,144,331 A * | 11/2000 | Jiang | 341/172 |
| 6,181,269 B1 * | 1/2001 | Nishiuchi et al. | 341/164 |
| 6,229,472 B1 * | 5/2001 | Nishida | 341/161 |
| 6,304,203 B1 * | 10/2001 | Yamada | 341/159 |
| 6,377,200 B1 | 4/2002 | Lee | |
| 6,570,520 B2 | 5/2003 | Ishii | |
| 6,583,745 B2 * | 6/2003 | Sakakibara et al. | 341/155 |
| 6,714,151 B2 | 3/2004 | Tachibana et al. | |
| 6,753,801 B2 * | 6/2004 | Rossi | 341/161 |
| 6,847,322 B2 * | 1/2005 | Yamada | 341/161 |
| 6,975,262 B2 * | 12/2005 | Yada et al. | 341/154 |

FOREIGN PATENT DOCUMENTS

JP 6-181435 6/1994

* cited by examiner

*Primary Examiner*—Khai M. Nguyen
(74) *Attorney, Agent, or Firm*—Banner & Witcoff, LTD

(57) ABSTRACT

An A/D converter has a first voltage generation circuit, a second voltage generation circuit, a comparator, first and second switch circuits connected in series between an input terminal of an analog input voltage and an output terminal of the first voltage generation circuit, a first capacitor inserted between a connection node between the first and second switch circuits and the first input terminal, a second capacitor inserted between an output terminal of the second voltage generation circuit and the second input terminal, a third switch circuit, a fourth switch circuit, an A/D converter which generates a digital signal in accordance with signal level of the first output terminal, and a voltage setting circuit which sets a voltage to be outputted from the first and second voltage generation circuits based on the digital signal.

20 Claims, 17 Drawing Sheets

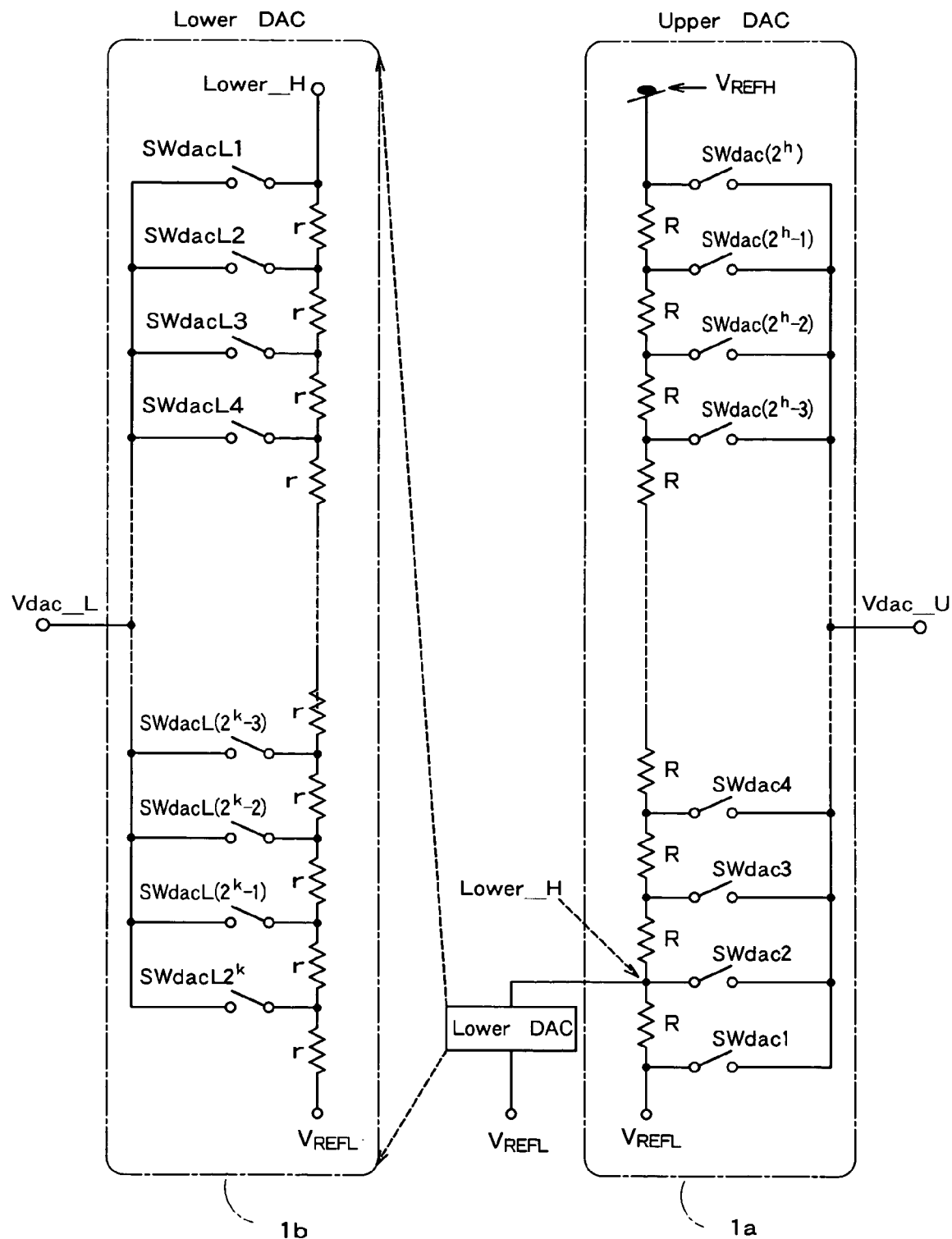
F I G. 2

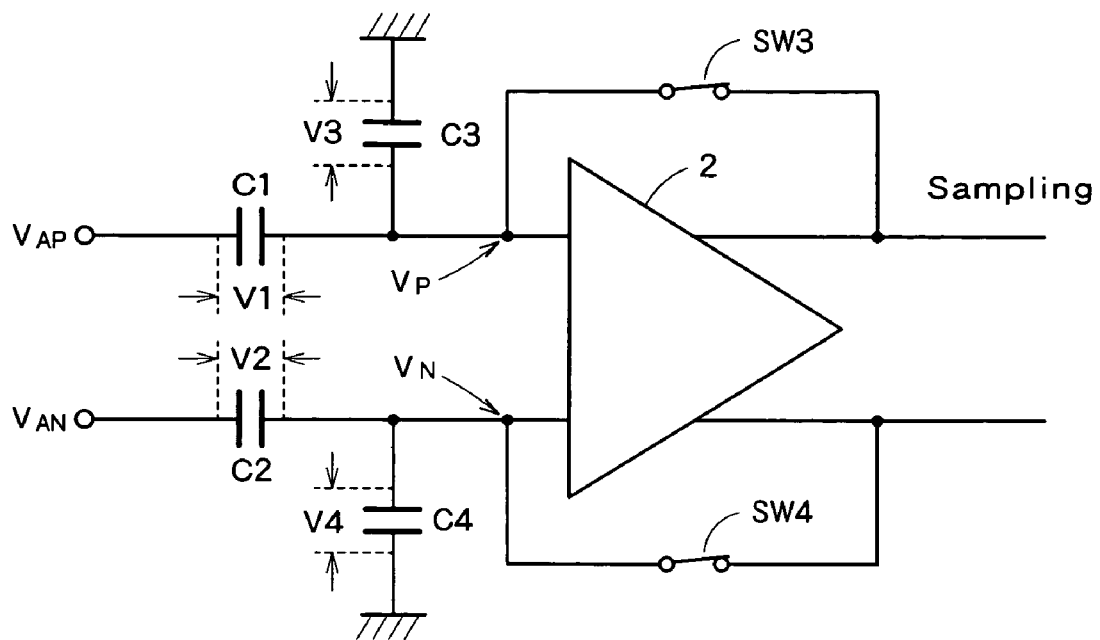
F I G. 5A
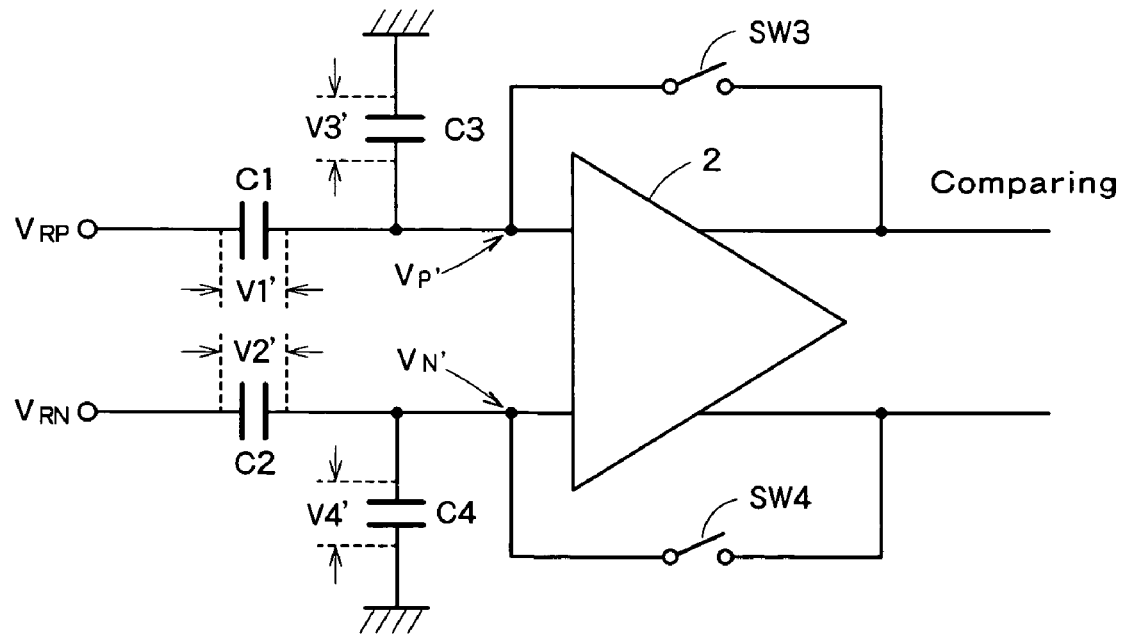
F I G. 5B

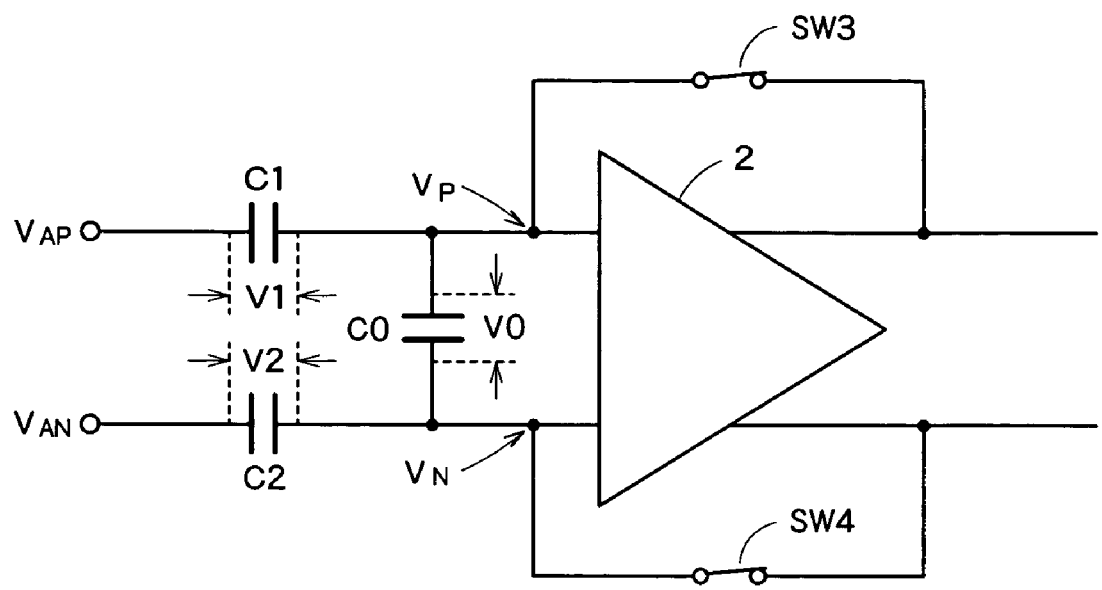
F I G. 7A
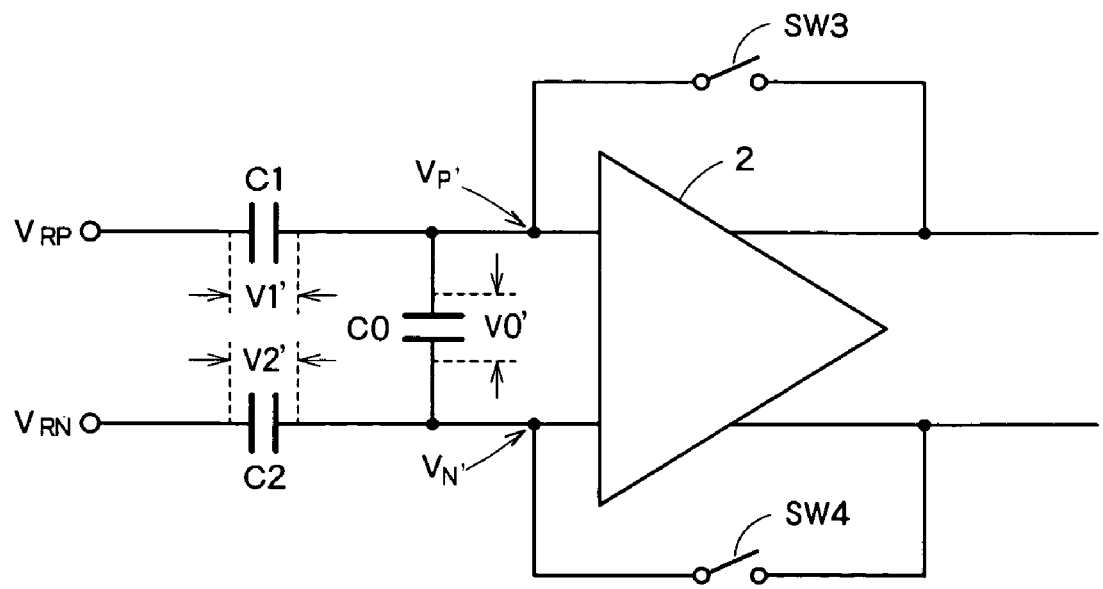
F I G. 7B

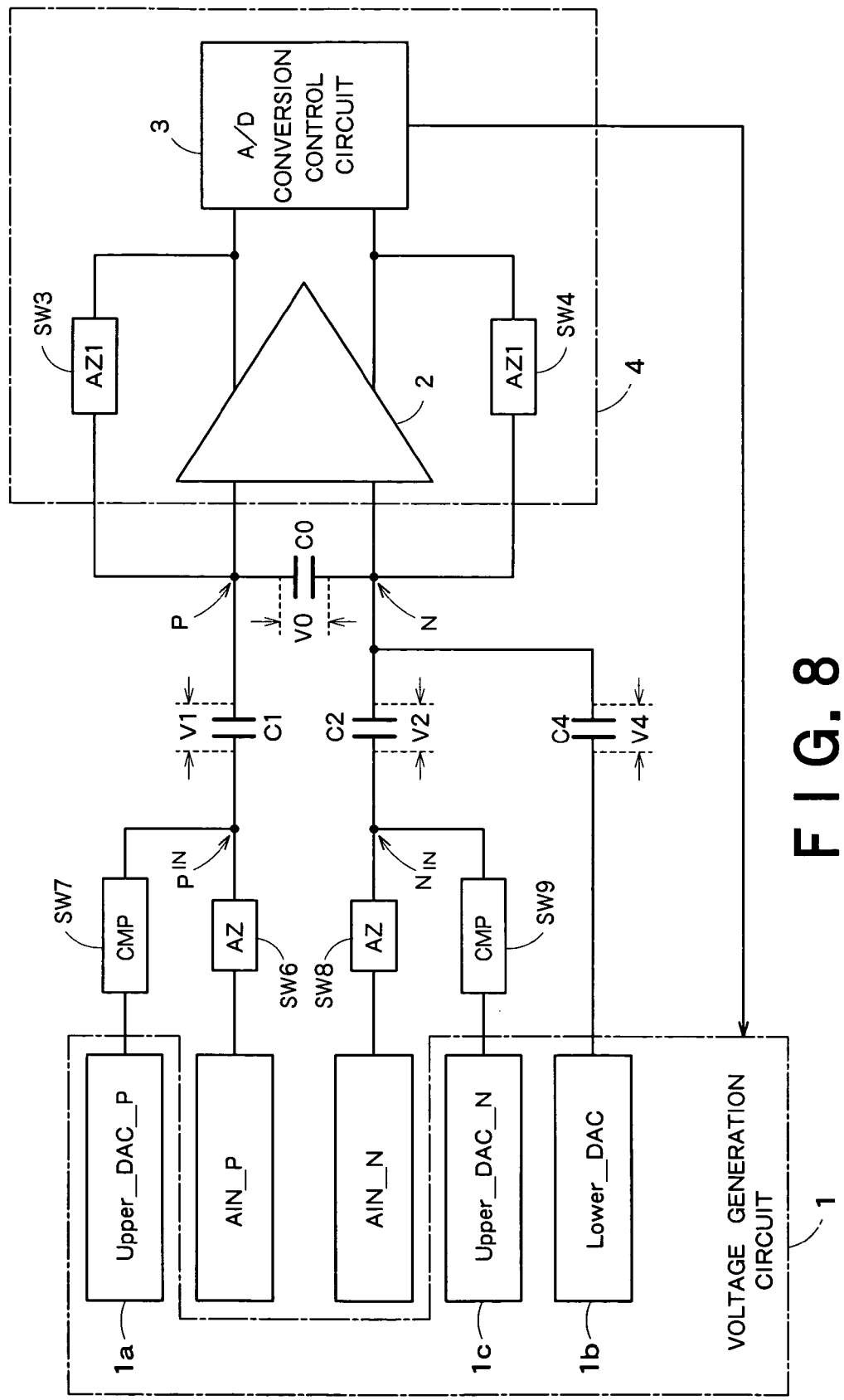
F I G. 8

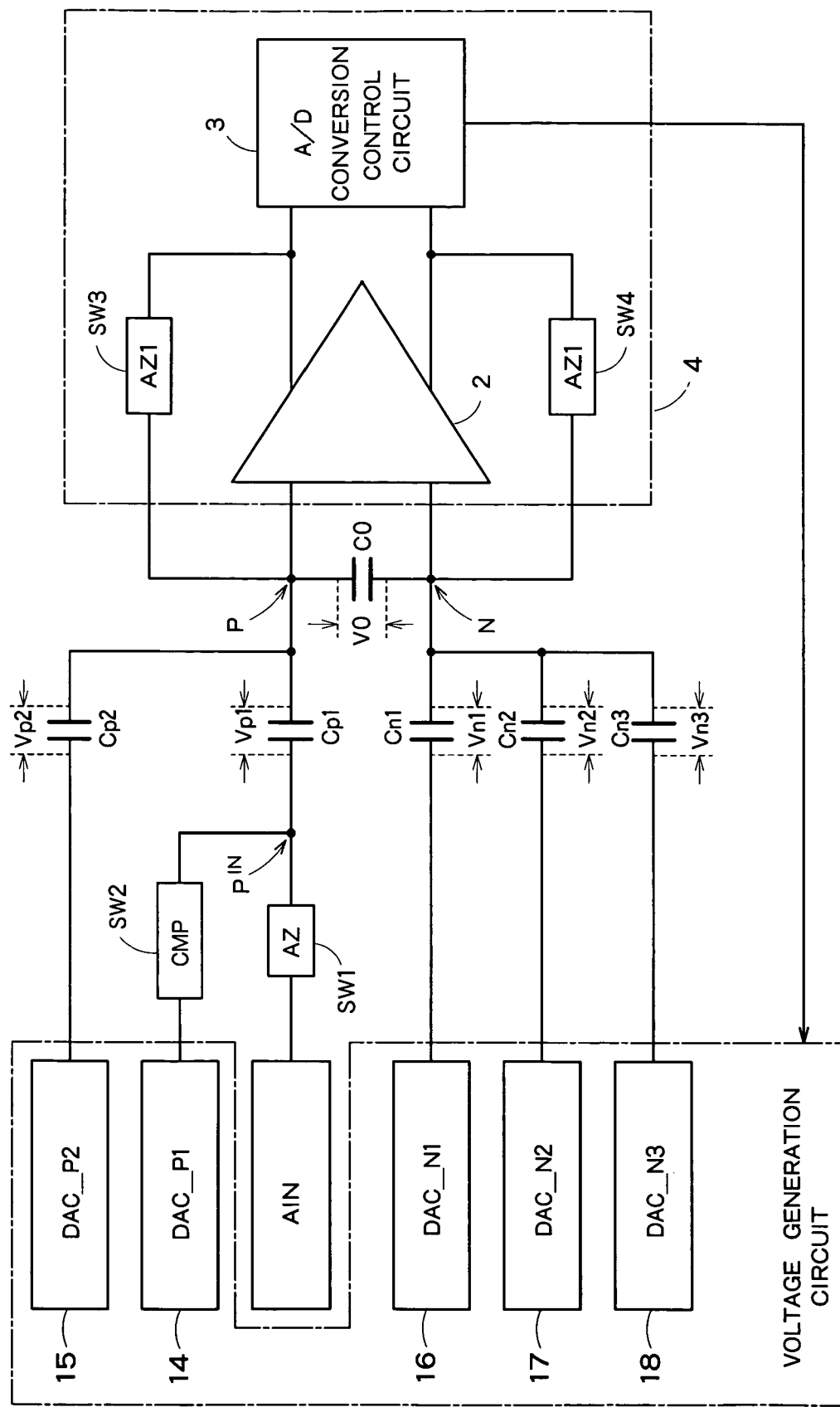
F I G. 12

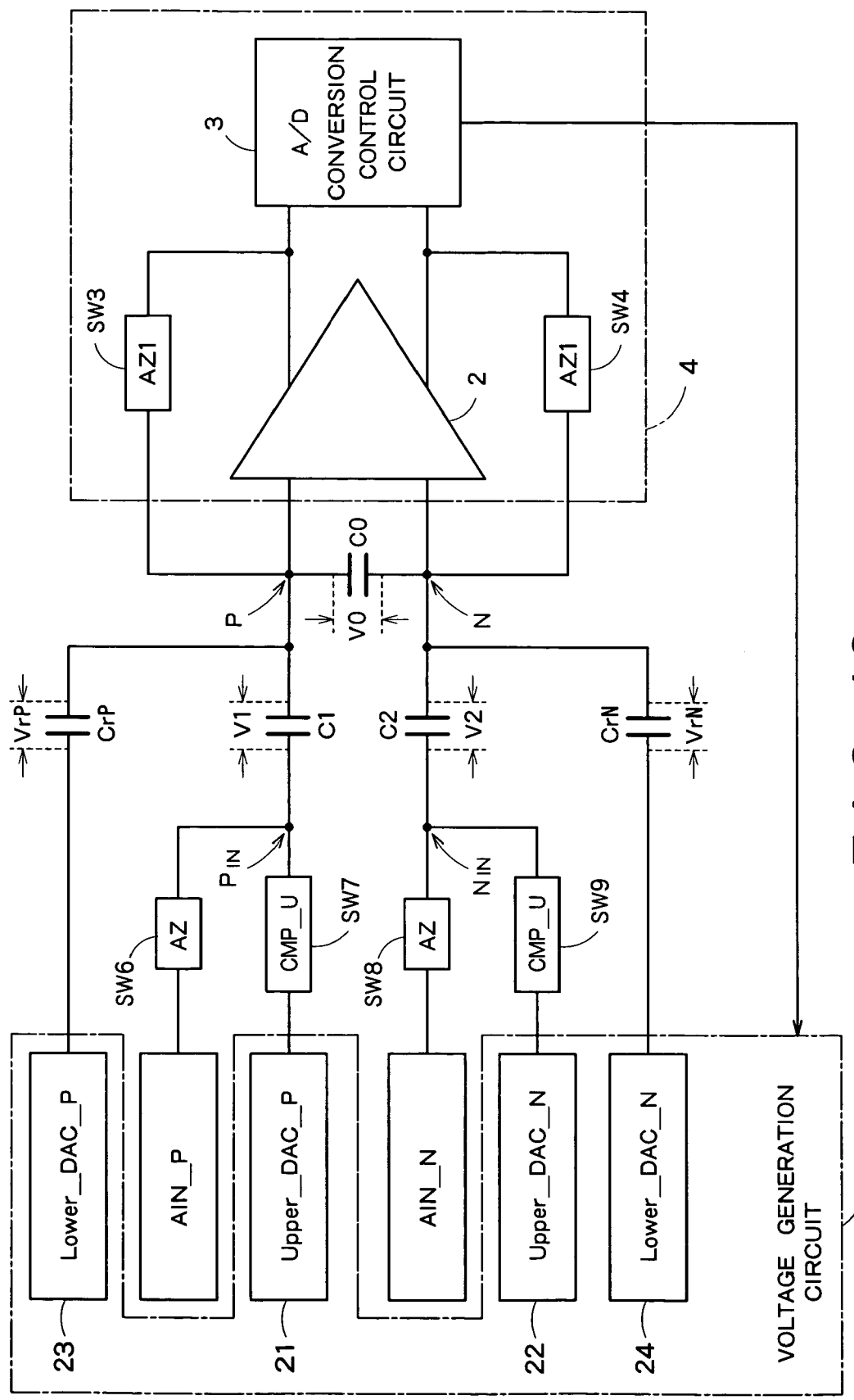
F I G. 13

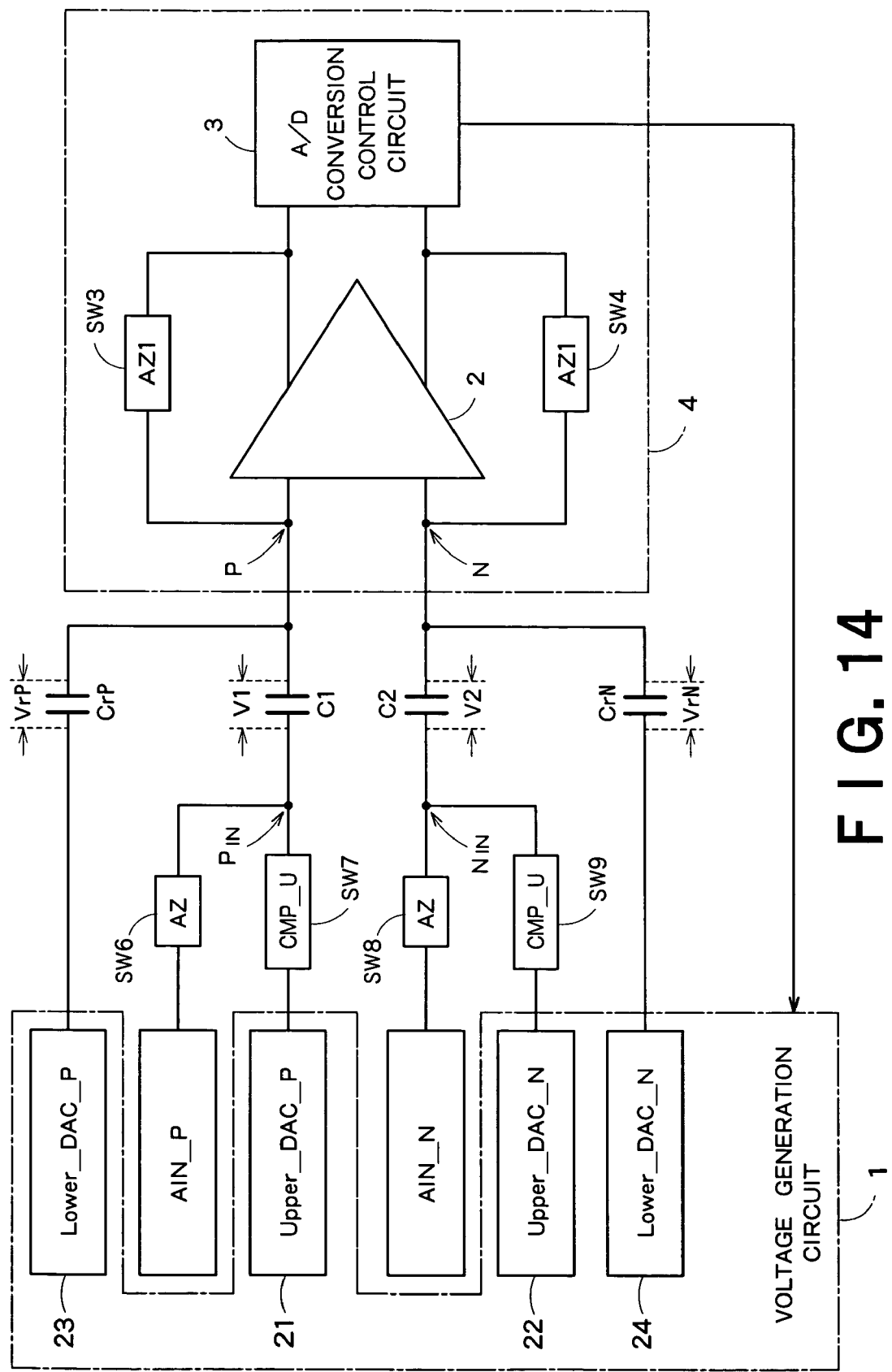
F I G. 14

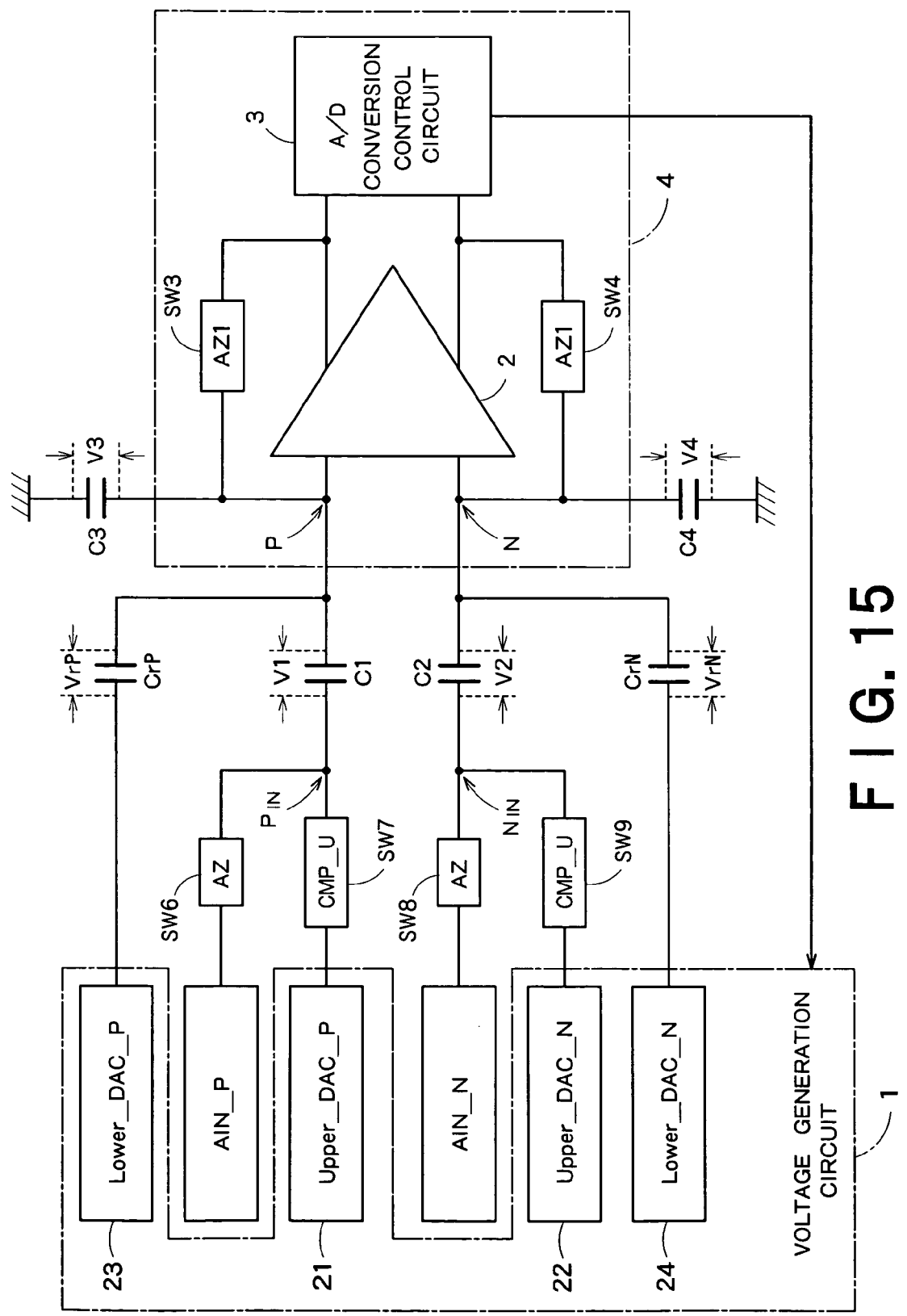
F I G. 15

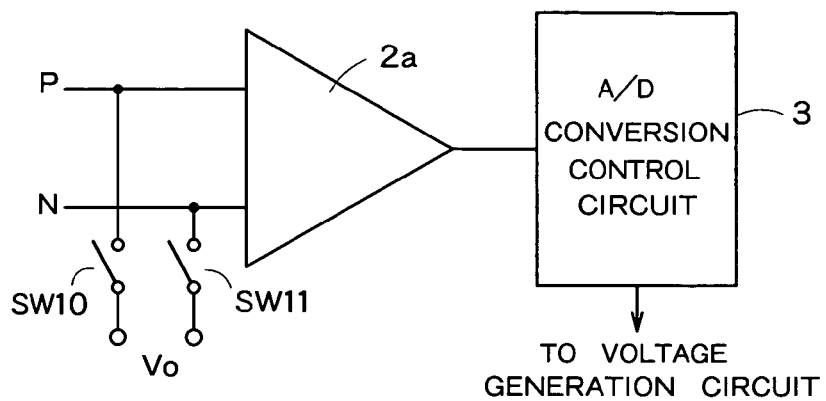
F I G. 19
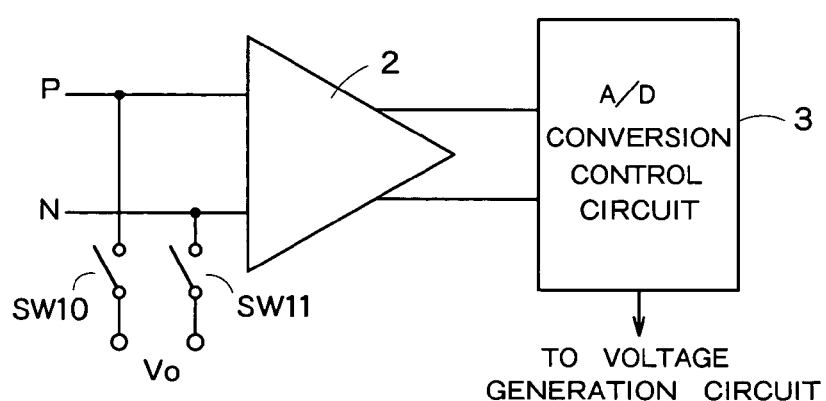
F I G. 20
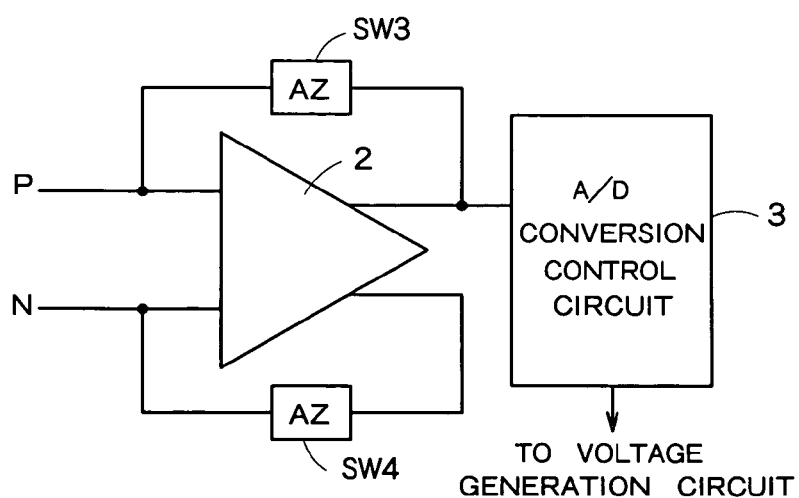
F I G. 21

A/D CONVERTER WITH VOLTAGE GENERATION CIRCUITS

CROSS REFERENCE TO RELATED APPLICATIONS

This application is based upon and claims the benefit of priority from the prior Japanese Patent Application No. 2005-219430, filed on Jul. 28, 2005, the entire contents of which are incorporated herein by reference.

BACKGROUND OF THE INVENTION

1. Field of the Invention

The present invention relates to a successive approximation register A/D converter.

2. Related Art

There has been known a successive approximation register A/D converter in which reference voltages generated by using a plurality of resistors connected in series are compared with an analog input voltage by a comparator to perform A/D conversion. By adjusting the number of resistors to be connected in series, it is possible to perform A/D conversion having a desired resolution. There has also been proposed an example in which the reference voltages are generated by using a current segment. The successive approximation register A/D converter has an advantage that an A/D converter having an optional resolution can be configured with a comparatively-simple circuit.

However, because a conventional successive approximation register A/D converter requires many resistors and switches in its inside, there is a problem that the whole circuit volume of the A/D converter increases. Moreover, in the case of the successive approximation register A/D converter, because a capacitor is connected to the input terminal of a comparator, the input voltage of the comparator may become out of the range of a power-supply voltage. In this case, because the comparator cannot correctly perform comparison operation, thereby exerting a harmful influence against accuracy of A/D conversion.

There has also been proposed an A/D converter improved so as to decrease the number of resistors to be connected in series (refer to Patent Document 1). The A/D converter disclosed in this official gazette divides a D/A converter having a plurality of resistors to be connected in series into two converters. An output of an upper side D/A converter is input to a comparator through a capacitor and an output of a lower side D/A converter is directly input to the comparator. An output signal of the upper side D/A converter is attenuated and input to the comparator due to parasitic capacitance of an input terminal of the comparator. However, an output signal of the lower side D/A converter is input to the comparator without being attenuated. Therefore, there is a problem that the accuracy of the upper side D/A converter is different from that of the lower side D/A converter.

SUMMARY OF THE INVENTION

According to one embodiment of the present invention, an A/D converter, comprising:
a first voltage generation circuit;
a second voltage generation circuit;
a comparator which has first and second input terminals and a first output terminal, and outputs from the first output terminal a signal in accordance with a potential difference between the first and second input terminals;
first and second switch circuits connected in series between an input terminal of an analog input voltage and an output terminal of the first voltage generation circuit;
a first capacitor inserted between a connection node between the first and second switch circuits and the first input terminal;
a second capacitor inserted between an output terminal of the second voltage generation circuit and the second input terminal;
a third switch circuit, one end of which is connected to the first input terminal, and which can set the first input terminal to an output common mode voltage or a predetermined voltage at conductive time;
a fourth switch circuit, one end of which is connected to the second input terminal, and which can set the second input terminal to the output common mode voltage or the predetermined voltage at conductive time;
an A/D conversion control circuit which generates a digital signal in accordance with signal level of the first output terminal; and
a voltage setting circuit which sets voltages to be outputted from the first and second voltage generation circuits based on the digital signal.

According to one embodiment of the present invention, an A/D converter, comprising:
a first voltage generation circuit which generates a voltage between first and second reference voltages;
a second voltage generation circuit which generates a voltage between third and fourth reference voltages;
a third voltage generation circuit which outputs a voltage having a polarity opposite to that of the output voltage of the first voltage generation circuit based on an intermediate voltage between the first and second reference voltages;
a comparator which has first and second input terminals and a first output terminal, and outputs from the first output terminal a voltage in accordance with a potential difference between the first and second input terminals;
first and second switch circuits connected in series between an input terminal of a first analog input voltage serving as one of an analog differential input voltage and an output terminal of the first voltage generation circuit;
third and fourth switch circuits connected in series between an input terminal of a second analog input voltage serving as the other of the analog differential input voltage and an output terminal of the third voltage generation circuit;
a first capacitor inserted between a connection node between the first and second switch circuits and the first input terminal;
a second capacitor inserted between a connection node between the third and fourth switch circuits and the second input terminal;
a third capacitor inserted between an output terminal of the second voltage generation circuit and the second input terminal:
a fifth switch circuit, one end of which is connected to the first input terminal and which can set the first input terminal to an output common mode voltage or a predetermined voltage at conductive time;
a sixth switch circuit, one end of which is connected to the second input terminal and which can set the second input terminal to an output common mode voltage or a predetermined voltage at conductive time;
an A/D conversion control circuit which generates a digital signal in accordance with signal level of the first output terminal; and a voltage setting circuit which sets voltages to be outputted from the first, second and third voltage generation circuits based on the digital signal.

BRIEF DESCRIPTION OF THE DRAWINGS

FIG. 2 is a circuit diagram showing an exemplary internal configuration of Upper_DAC1a and Lower_DAC1b;

FIGS. 5A and 5B are detailed circuit diagrams around a comparator 2;

FIG. 7A is a circuit diagram when third and fourth switches SW3 and SW4 are turned on;

FIG. 7B is a circuit diagram when the third and fourth switches SW3 and SW4 are turned off;

FIG. 8 is a block diagram showing a schematic configuration of an A/D converter of fourth embodiment of the present invention;

FIG. 12 is a block diagram showing an exemplary A/D converter obtained by dividing DAC into five parts;

FIG. 13 is a block diagram showing an exemplary A/D converter in which Upper_DAC1a and Lower_DAC1b respectively generate a differential voltage;

FIG. 14 is a circuit diagram in which an input attenuation capacitor is omitted from FIG. 13;

FIG. 15 is a circuit diagram in which an input attenuation capacitor is connected to a place different from the case of FIG. 13;

FIG. 19 a circuit diagram around a single-ended output comparator when using the comparator;

FIG. 20 is a circuit diagram showing an example of changing the connection mode of the comparator in FIG. 1 or the like; and FIG. 21 is a circuit diagram showing an example different from the case of FIG. 20.

DETAILED DESCRIPTION OF THE INVENTION

Figure 1:
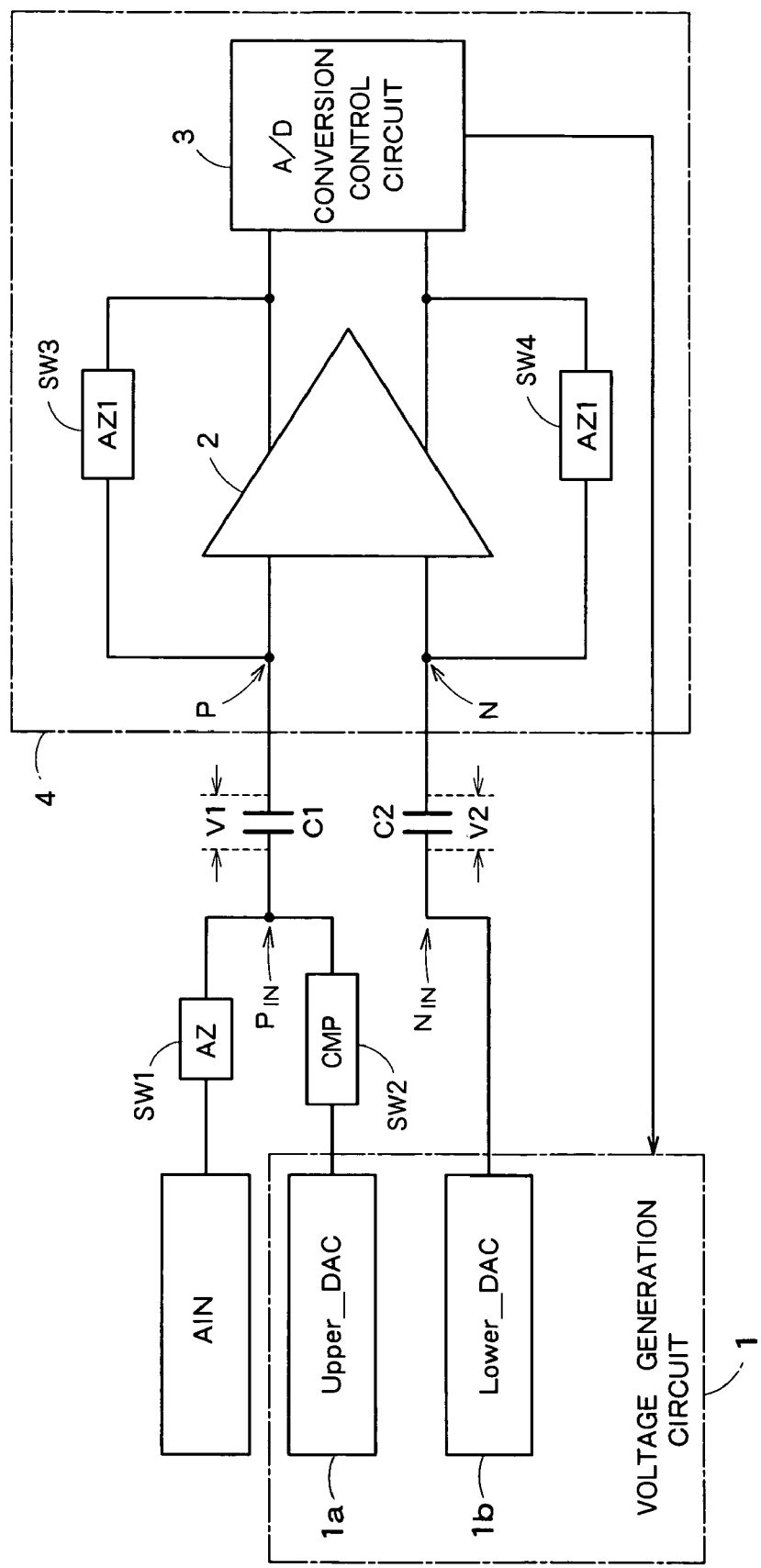
FIG. 1 is a block diagram showing a schematic configuration of an A/D converter of first embodiment of the present invention.

An embodiment of the present invention is described below by referring to drawings. FIG. 1 is a block diagram showing a schematic configuration of an A/D converter according to a first embodiment of the present invention. The A/D converter in FIG. 1 has a voltage generation circuit 1, comparator 2, A/D conversion control circuit 3, first to fourth switches SW1 to SW4, and first and second capacitors C1 and C2. The A/D converter in FIG. 1 performs n-bit A/D conversion. The comparator 2, A/D conversion control circuit (voltage setting circuit) 3, third switching circuit SW3, and fourth switching circuit SW4 serve as an A/D conversion portion 4.

The voltage generation circuit 1 has two D/A converters. Hereafter, one of these D/A converters is referred to as Upper_DAC1a (first voltage generation circuit) and the other is referred to as Lower_DAC1b (second voltage generation circuit). The resolution of the Upper_DAC1a is h bits and that of the Lower_DAC1b is k bits (h and k are positive integers and n=h+k).

FIG. 2 is a circuit diagram showing one example of internal configuration of Upper_DAC1a and Lower_DAC1b. As shown in FIG. 2, Upper_DAC1a has at least $(2^h-2)$ pieces of resistors connected in series between a first reference voltage VREFH and a second reference voltage VREFL, and at least $(2^h-1)$ pieces of switches SWdac1 to SWdac(2h-1) to be connected to a connection node between these resistors. The other ends of these switches are connected to an output terminal Vdac_U. At least one of these switches is turned on and voltages divided by at least $(2^h-2)$ pieces of resistors are output.

Lower_DAC1b is connected to two optional terminals in Upper_DAC1a and its output voltage range is equal to 1LSB of the output voltage of Upper_DAC1a and the output voltage is designed so as to become voltages obtained by further dividing 1LSB of the output voltage of Upper_DAC1a. More specifically, Lower_DAC1b has at least $2^k$ (k is integer of 1 or more) pieces of resistors in series between two optional terminals in Upper_DAC1a and $2^k$ switches SWdac1 to SWdac$2^k$ to be connected to a connection node between these resistors. Other ends of these switches are connected to an output terminal Vdac_L. One of these switches is turned on and voltages divided by $2^k$ resistors are output. The example in FIG. 2 shows that $2^k$ resistors in Lower_DAC1b are connected between both ends of a resistor located at the lowest end of Upper_DAC1a. However, it is also allowed to connect Lower_DAC1b between other terminals in Upper_DAC1a. Moreover, in the case of the example in FIG. 2, all values of $2^k$ resistors of Lower_DAC1b are r. However, it is allowed that some resistance values are different. For example, according to a position where Lower_DAC1b is connected to Upper_DAC1a, when the lowest-end resistance value in Lower_DAC1b is adjusted, an output voltage range becomes equal to 1LSB of an output voltage of Upper_DAC1a, and the output voltage is set to a voltage obtained by further dividing the output voltage of Upper_DAC1a for 1LSB.

FIG. 2 shows an example in which Upper_DAC1a and Lower_DAC1b are composed of a plurality of resistors connected in series. However, Upper_DAC1a and Lower_DAC1b may be composed of a plurality of MOS transistors connected in series or other various impedance devices instead of resistors. Moreover, Upper_DAC1a and Lower_DAC1b may be composed independently from each other. Alternatively, Upper=DAC1a and Lower_DAC1b may be comprised of current-segment DAC or R-2R DAC instead of impedance devices connected in series. Internal configuration of Upper_DAC1a may be different from that of Lower_DAC1b. For example, it is possible that Upper_DAC1a is composed of a current segment DAC and Lower_DAC 1b is composed of an R-2R DAC. Even if any configuration is used, when the output voltage range of Lower_DAC1b is equal to 1LSB of the output voltage of Upper_DAC1a and the output voltage is a voltage obtained by further dividing the output voltage of Upper_DAC1a for 1LSB, it is possible to use the divided voltage instead of the voltages of Upper_DAC1a and Lower_DAC1b in FIG. 2. The output voltage may not be necessarily the direct output of Upper_DAC1a.

The comparator 2 outputs a signal corresponding to the voltage difference between the voltage of a first input terminal P (positive input terminal) and the voltage of a second input terminal N (negative input terminal) from a first output terminal and a second output terminal.

A first switch (AZ) SW1 and a second switch (CMP) SW2 are connected in series between the input terminal to which an analog input voltage VAIN is input and the output terminal of Upper_DAC1a. A first capacitor C1 is connected between the connection node of these switches and the first input terminal P of the comparator 2 and a second capacitor C2 is connected between the output terminal of Lower_DAC1b and the second input terminal N of the comparator 2.

A third switch (AZ1) SW3 is connected between the first input terminal P and the first output terminal of the comparator 2 and a fourth switch (AZ1) SW4 is connected between the second input terminal N and the second output terminal of the comparator 2.

The A/D converter in FIG. 1 can perform n (=h+k) bits A/D conversion. A conventional successive approximation register A/D converter requires at least ($2^n-2$) (n is positive integer) pieces of resistors and at least ($2^n-1$) (n is positive integer) pieces of switches in order to perform n-bit A/D conversion. However, this embodiment requires only at least $\{(2^h)+2^k\}$ pieces of resistors and at least $\{(2^h-1)+2^k\}$ pieces of switches. Therefore, the number of resistors and the number of switches can be greatly decreased than ever, a circuit volume can be decreased, and layout area can be decreased. Moreover, parasitic capacitance can be decreased by decreasing the number of switches, and the settling time of the output potential of the voltage generation circuit 1 can be decreased.

The A/D-conversion control circuit 3 controls voltages output from Upper_DAC1a and Lower_DAC1b in the voltage generation circuit 1 on the basis of the output voltage of the comparator 2, and further generates a digital signal which is an A/D conversion result. Specifically, when an output voltage of Upper_DAC1a becomes lower than the analog input voltage VAIN, an output signal of the comparator 2 becomes a value corresponding to the output voltage and the A/D conversion control circuit 3 raises the output voltage of Upper_DAC1a. Conversely, when the output voltage of Upper_DAC1a is higher than the analog input voltage VAIN, the circuit 3 lowers the output voltage of Upper_DAC1a. According to such a feedback control, the output voltage of Upper_DAC1a approaches the analog input voltage VAIN. The A/D conversion control circuit 3 also controls Lower_DAC1b. However, Lower_DAC1b is connected to the negative input terminal of the comparator 2, different from Upper_DAC1a. Therefore, Lower_DAC1b is feedback-controlled in the direction opposite to that of Upper_DAC1a and the voltage difference voltage between the output voltage of Lower_H and that of Lower_DAC1b approaches the voltage difference voltage between the analog input voltage VAIN and the output voltage of Upper_DAC1a.

Figure 3:
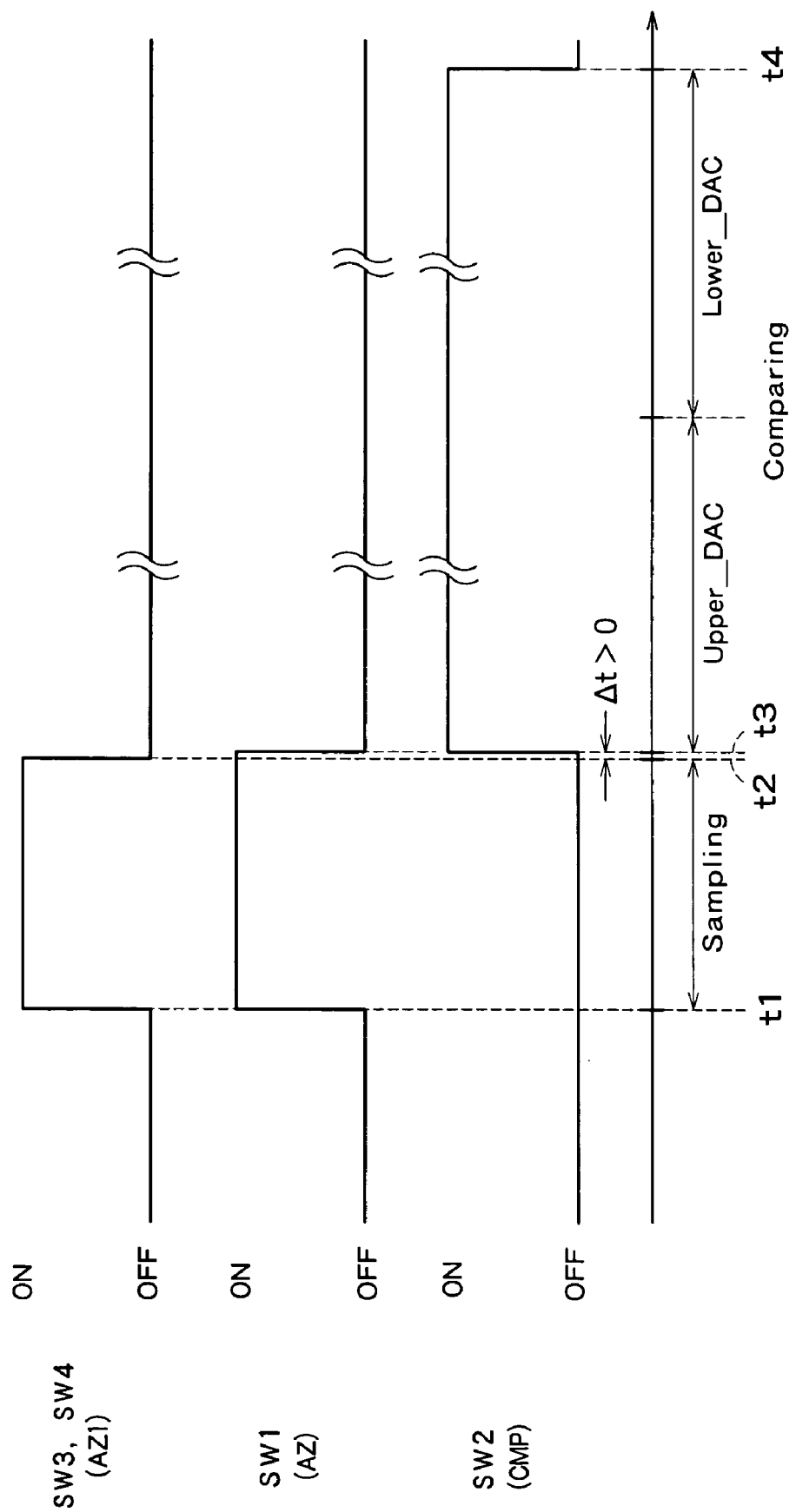
FIG. 3 is an operation timing diagram of the A/D converter in FIG. 1.

FIG. 3 is an operation timing chart of the A/D converter in FIG. 1. Hereafter, operations of the A/D converter in FIG. 1 will be described by referring to the operation timing chart. Time t1 to t2 is a sampling period, the second switch SW2 is turned off, and the first switch SW1, third switch SW3, and fourth switch SW4 are turned on. Therefore, the input/output terminal of the comparator 2 is shorted, negative feedback is applied to the comparator 2, and the first and second input terminals P and N become the output common mode voltage VCM of the comparator 2. In this case, electric charges Q1 and Q2 accumulated in the first and second capacitors C1 and C2 are shown by the following expressions (1) and (2), respectively. In this period, the output voltage Vdac_L of Lower_DAC1b is set to the maximum value Lower_H of an output value of the Lower_DAC1b.

$$Q1 = C1 \cdot V1 = C1(VAIN - VCM) \quad (1)$$

$$Q2 = C2 \cdot V2 = C2(VCM - Vdac\_L) \quad (2)$$

At the time t2, the third and fourth switches SW3 and SW4 are turned off. At the time t3 immediately after the time t2, the second switch SW2 is turned on and the first switch SW1, third switch SW3, and fourth switch SW4 are turned off. Therefore, the electric charges accumulated in the first and second capacitors C1 and C2 have no path to flow, and the same amount of electric charge as that accumulated in sampling time is held according to a law of conservation of electric charges.

The output voltage of Upper_DAC1a is supplied to one end PIN of the first capacitor C1 through the second switch SW2. Upper_DAC1a firstly outputs an intermediate voltage between a first reference voltage VREFH and a second reference voltage VREFL. For example, when the analog input voltage VAIN is higher than the intermediate voltage, the voltage of the other end P (first input terminal P of comparator 2) of the first capacitor C1 lowers in accordance with the law of conservation of electric charges. The comparator 2 detects this voltage and outputs a signal corresponding to an input. By receiving the signal, the A/D conversion control circuit 3 controls the output voltage of Upper_DAC1a so that the voltage becomes an intermediate voltage between the above intermediate voltage and the first reference voltage VREFH. By repeating this processing, the output voltage of Upper_DAC1a approaches the analog input voltage VAIN. The number of repetitions depends on the number of bits of a resistance in Upper_DAC1a and the number of repetitions increases as the number of bits of a resistance increases.

Finally, the output voltage of Upper_DAC1a becomes a value closest to the analog input voltage VAIN and smaller than VAIN. Hereafter, Upper_DAC1a is fixed to this voltage. Under this state, Lower_DAC1b is adjusted. The initial output voltage of Lower_DAC1b is set to the voltage of a connection node between resistors at the intermediate position of a plurality of resistors connected in series. Because this initial output voltage is lower than the output voltage VdacL of Lower_DAC1b in a sampling period, the voltage of the second input terminal N (point N) of the comparator 2 lowers and the output of the comparator 2 outputs a signal corresponding to an input.

By receiving the signal, the A/D conversion control circuit 3 controls Lower_DAC1b so that the Lower_DAC1b outputs an intermediate voltage between the initial output voltage and the second reference voltage VREFL or an intermediate voltage between the initial output voltage and the voltage at the connection point Lower_H of Lower_DAC1b and Upper_DAC1a. When Lower_DAC1b outputs the intermediate voltage, the voltage at the other end N of the second capacitor C2 lowers or rises. Then, the comparator 2 compares voltages at the points P and N and outputs a signal corresponding to the comparison result.

Hereafter, the same processing is repeated. According to the above processing, the analog input voltage VAIN is converted into n-bit digital data.

Thus, in the first embodiment, electric charges are accumulated to the first capacitor C1 corresponding to the analog input voltage VAIN during sampling (time t1 to t2). In this sampling period, though the output voltage of Upper_DAC1a is optional, the output voltage of Lower_DAC1b is set to Lower_H. While voltages are compared (times t3 to t4), the output voltage of Upper_DAC1a is firstly sequentially changed to compare the output voltage with the analog input voltage VAIN and to set the output voltage of Upper_DAC1a to a voltage closest to the analog input voltage VAIN and lower than VAIN. Then, the output voltage of Lower_DAC1b is sequentially changed, and finally the voltage difference between the voltage at Lower_H and the output voltage of Lower_DAC1b is set to a voltage lower than and closest to the voltage difference between the analog input voltage VAIN and the output voltage of Upper_DAC1a.

In this embodiment, the analog input voltage VAIN is compared with the output of the voltage generation circuit 1, which is divided into Upper_DAC1a and Lower_DAC1b, and the outputs of the Upper_DAC1a and the Lower_DAC1b are inputted into different input terminals of the comparator 2 through the different capacitors C1 and C2, respectively. Therefore, it is possible to greatly decrease the number of switches and the number of resistors and decrease a circuit volume and layout area, as compared with the case of performing comparison by only one DAC or changing the connection node between Lower_DAC1b and Upper_DAC1a in accordance with the output of Upper_DAC1a. Moreover, because outputs of Upper_DAC1a and Lower_DAC1b are separately input to different input terminals of the comparator 2, it is possible to use both-end voltages of one particular resistor in Upper_DAC1a as the reference voltage of Lower_DAC1b and fix the connection node between Upper_DAC1a and Lower_DAC1b. Therefore, it is possible to simplify a circuit configuration.

Furthermore, by decreasing the number of switches, it is possible to decrease a parasitic capacitance and shorten the settling time of the output potential of the voltage generation circuit 1 and A/D conversion time.

Furthermore, in the case of this embodiment, not only the output signal of Upper_DAC1a but also the output signal of Lower_DAC1b is input to the comparator 2 through a capacitor. When values of the capacitors C1 and C2 are the same, it is possible to set values of parasitic capacitances at the input terminals P and N of the comparator 2 equal on design. Therefore, output signals of Upper_DAC1a and Lower_DAC1b are equally attenuated due to a parasitic capacitance. That is, according to this embodiment, it is possible to prevent accuracy deterioration shown in Patent Document 1.

Second Embodiment

In a second embodiment, input attenuation capacitors are connected to the first input terminal P and the second input terminal N of the comparator 2.

Figure 4:
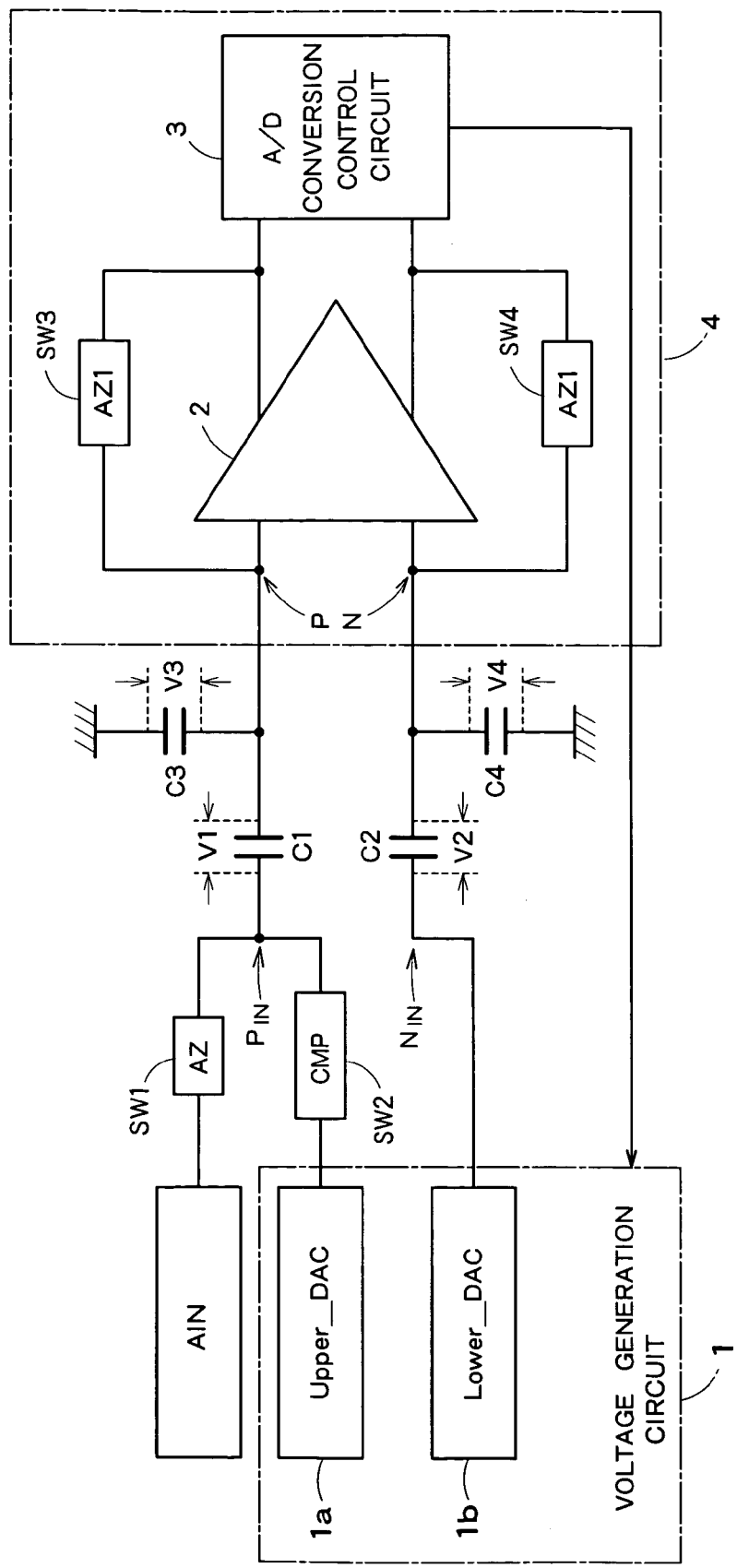
FIG. 4 is a block diagram showing a schematic configuration of an A/D converter of second embodiment of the present invention.

FIG. 4 is a block diagram showing a schematic configuration of the A/D converter according to the second embodiment of the present invention. In FIG. 4, a component common to that in FIG. 1 is provided with the same symbol and different points are mainly described below.

In addition to the configuration in FIG. 1, the A/D converter in FIG. 4 has a first input attenuation capacitor C3 to be connected between the first input terminal P of the comparator 2 and the ground terminal and a second input attenuation capacitor C4 to be connected between the second input terminal N of the comparator 2 and the ground terminal. In FIG. 4, though the input attenuation capacitors C3 and C4 are connected to the ground terminal, it is not always necessary that a connection position is the ground terminal. In the case of a terminal for keeping a constant voltage value between t1 and t4 in FIG. 3, it is allowed that C3 and C4 are connected to a terminal other than the ground terminal or terminals of different voltage values.

The operation timing of the A/D converter in FIG. 4 is the same as the case of FIG. 3. The potential difference (VP'−VN') between the voltage VP' at the first input terminal P and the voltage VN' at the second input terminal N of the comparator 2 while the comparator 2 performs voltage comparison is shown by the following expression (3).

$$V'_P - V'_N = \frac{C_1 C_2}{(C_1 + C_3)(C_2 + C_4)}\left\{\left(1 + \frac{C_4}{C_2}\right)(V_{RP} - V_{AP}) - \left(1 + \frac{C_3}{C_1}\right)(V_{RN} - V_{AN})\right\} \quad (3)$$

$$= \frac{C_1 C_2}{(C_1 + C_3)(C_2 + C_4)}\left\{\left(2 + \frac{C_3}{C_1} + \frac{C_4}{C_2}\right)(V_{RD} - V_{AD}) - \left(\frac{C_3}{C_1} - \frac{C_4}{C_2}\right)(V_{RC} - V_{AC})\right\}$$

The introduction process of expression (3) will be described later. In expression (3), VRP denotes the potential at the point PIN while voltages are compared, VAP denotes the potential of the point PIN during sampling, VRN denotes the potential of the point NIN during voltage comparison, VAN denotes the potential of the point NIN during sampling, VRD and VRC are the differential mode component (VRD) and common mode component (VRC) of VRP and VRN, and VAD and VAC are the differential mode component (VAD) and common mode component (VAC) of VAP and VAN.

The output voltage Vr0 of Lower_DAC1b is constant and VRN=VAN=Vr0 during sampling and voltage comparison by Upper_DAC1a.

Moreover, the output voltage VRP of Upper_DAC1a is constant (output voltage of final Upper_DAC1a comparison) during voltage comparison by Lower_DAC1b and when setting VRN to Vr0+VΔ, VRN−VAN=Vr0+Vr0−VΔ=VΔ is realized and expression (3) becomes like expression (4).

$$V'_P - V'_N = \frac{C_1 C_2}{(C_1 + C_3)(C_2 + C_4)}\left\{\left(1 + \frac{C_4}{C_2}\right)(V_{RP} - V_{AP}) - \left(1 + \frac{C_3}{C_1}\right) \cdot V_\Delta\right\} \quad (4)$$

As shown in expression (4), because the output voltage Vr0 of Lower_DAC1b is constant during sampling and voltage comparison by Upper_DAC1a, determination of the comparator does not depend on the ratio between the capacitors C1 and C3.

From the above-described expression (3), it is found that the A/D converter in FIG. 4 has the following features a) to c).

a) The positive or negative state of the input potential difference of the comparator 2 is decided by the analog input voltage VAIN, voltages at the points PIN and NIN (VRP, VAP, VRN, and VAN), first and second capacitors C1 and C2, and first and second input attenuation capacitors C3 and C4.

b) The input potential difference of the comparator 2 is decided by the input common mode component, input differential component, first and second capacitors C1 and C2, and first and second input attenuation capacitors C3 and C4.

c) When the ratio C3/C1 between capacitors on the point-P-side route of the comparator 2 is not equal to the ratio C4/C2 of capacitors on the N-side route, the influence of the difference between common mode component VAC of VAP and VAN and the common mode component VRC of VRP and VRN appears. That is, the accuracy of an A/D converter is deteriorated.

The A/D converter in FIG. 4 has an advantage capable of decreasing the number of switches and the number of resistors similarly to the case of the first embodiment and moreover, an advantage capable of preventing deterioration of the accuracy of an A/D converter by preventing the overflow of the input voltage of the comparator 2. These advantages are described below by referring to FIG. 5. FIGS. 5A and 5B are detailed circuit diagrams around the comparator 2, in which FIG. 5A is a circuit diagram when the third and fourth switches SW3 and SW4 are turned on and FIG. 5B is a circuit diagram when the third and fourth switches SW3 and SW4 are turned off.

In this case, the term "overflow" represents that forward current flows through the PN junction of a switch connected to the input terminal of the comparator 2. The overflow does not occur when the voltage applied to the input terminal of the comparator 2 is within a range of the power supply voltage, and the overflow occurs when being out of the range. If the overflow occurs, the accuracy of an A/D converter may be deteriorated. When a voltage in a power-supply voltage range is applied to a switch, the current is normally small enough. Therefore, in the following description, it is assumed that when a voltage to be applied to a switch is kept in the power-supply-voltage range, overflow does not occur. Here, it is assumed that VAN=Lower_H, VRP=1.25 V, and VRN=Lower_H and the power-supply-voltage range is kept from 0 to 2.5 V. In this case, conditions in which input voltages VP' and VN' of the comparator 2 do not overflow are shown by the following expressions (5) and (6).

$$0 \leq VP' \leq 2.5 \text{ V} \tag{5}$$

$$0 \leq VN' \leq 2.5 \text{ V} \tag{6}$$

Input voltages VP' and VN' of the comparator 2 are shown by the following expressions (7) and (8).

$$V'_P = \frac{C_1}{C_1 + C_3} \{(V_{RD} + V_{AD}) + (V_{RC} - V_{AC}) + V_{CM}\} \tag{7}$$

$$V'_N = \frac{C_2}{C_2 + C_4} \{-(V_{RD} + V_{AD}) + (V_{RC} - V_{AC}) + C_{CM}\} \tag{8}$$

It is possible to derive the lower limit and upper limit of VCM by using expressions (5) to (8) when VAP=2.5 V and VAP=0 V and the following expressions (9) and (10) are obtained.

$$\frac{1}{1 + \frac{C_3}{C_1}} \times 1.25 < V_{CM} < 2.5 - \frac{1}{1 + \frac{C_3}{C_1}} \times 1.25 \tag{9}$$

$$\frac{1}{1 + \frac{mC_3}{kC_1}} \times 1.25 < V_{CM} < 2.5 - \frac{1}{1 + \frac{mC_3}{kC_1}} \times 1.25 \tag{10}$$

As shown in expressions (9) and (10), input voltages VP' and VN' of the comparator 2 do not exceed the power-supply voltage ranges from 0 to 2.5 V when the common-mode voltage VCM is kept in the range of expressions (9) and (10) even if the common-mode voltage VCM is deviated and it is possible to prevent overflow.

Thus, according to the second embodiment, because the first and second input attenuation capacitors C3 and C4 are respectively connected to the first and second input terminals P and N of the comparator 2, the input voltages VP' and VN' of the comparator 2 may not exceed the power-supply-voltage range when the VCM is kept in the range of expressions (9) and (10) even if VCM is deviated and it is possible to securely prevent deterioration of the accuracy of an A/D converter. Moreover, according to this embodiment, by equalizing values of the capacitors C1 and C2 and equalizing values of the capacitors C3 and C4, it is possible to prevent accuracy deterioration due to a parasitic capacitance similarly to the case of the first embodiment. Furthermore, if capacitance values of C3 and C4 are sufficiently larger than a parasitic capacitance, there is an advantage that it is possible to sufficiently decrease the influence of the parasitic capacitance.

Third Embodiment

In a third embodiment, an input attenuation capacitor is connected to different nodes from the case of the second embodiment.

Figure 6:
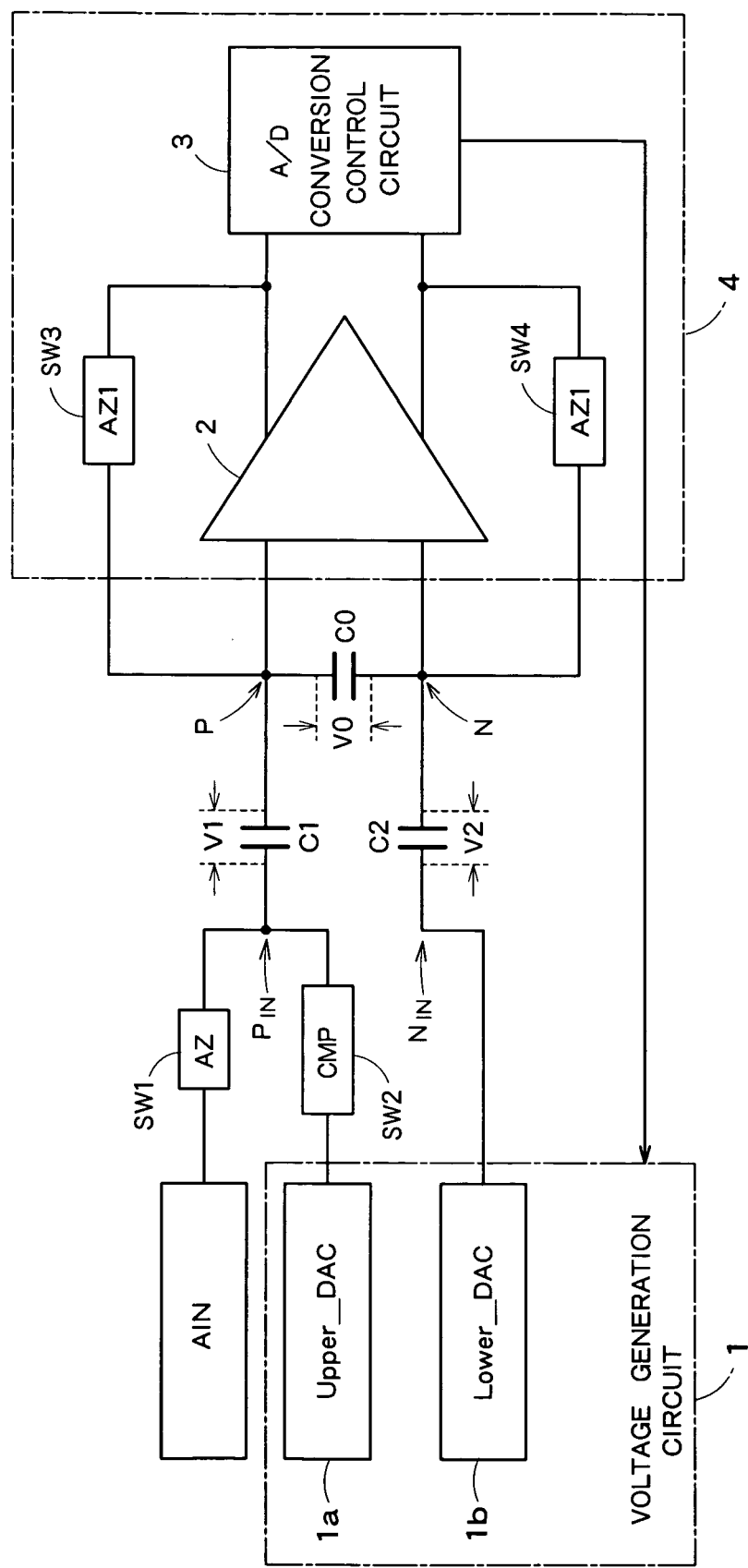
FIG. 6 is a block diagram showing a schematic configuration of an A/D converter of third embodiment of the present invention.

FIG. 6 is a block diagram showing a schematic configuration of the A/D converter of the third embodiment. In FIG. 6, the same reference numerals are attached to constituents common to FIG. 1. Hereafter, different points will be mainly described.

The A/D converter in FIG. 6 has an input attenuation capacitor C0 to be connected between the first and the second input terminals P and N of the comparator 2 in addition to the configuration in FIG. 1.

The A/D converter shown in FIG. 4 is affected by dispersion (mismatching) of capacitances of the first and second input attenuation capacitors C3 and C4. However, in the case of the third embodiment, the input attenuation capacitors C3 and C4 are not connected to the first and second input terminals P and N, respectively, but an input attenuation capacitor C0 is connected only between the first and second input terminals P and N. Therefore, a problem due to capacitor mismatching like the case of the second embodiment does not occur.

The operation timing of the A/D converter in FIG. 6 is the same as the case of FIG. 3. The input potential difference (VP'−VN') of the comparator 2 during voltage comparison is shown by the following expression (11).

$$V'_P - V'_N = \frac{C_1 C_2}{C_1 C_2 + C_2 C_0 + C_0 C_1}\{(V_{RP} - V_{AP}) - (V_{RN} - V_{AN})\} \quad (11)$$

$$= \frac{2C_1 C_2}{C_1 C_2 + C_2 C_0 + C_0 C_1}(V_{RD} - V_{AD})$$

The introduction process of expression (11) will be described later. The output voltage Vr0 of Lower_DAC1$b$ is constant during sampling and voltage comparison by Upper_DAC1$a$ and the potential VRN at the point NIN during voltage comparison and the potential VAN at the point NIN during sampling respectively become the potential Vr0.

The potential VRP at the point PIN during voltage comparison by Lower_DAC1$b$ becomes the final voltage value at the time of voltage comparison by Upper_DAC1$a$. When assuming point-NIN potential as VRN=Vr0+VΔ, the following expression VRN−VAN=Vr0+VΔ−Vr0=VΔ is obtained. Therefore, the input potential difference of the comparator 2 is shown by the following expression (12).

$$V'_P - V'_N = \frac{C_1 C_2}{C_1 C_2 + C_2 C_0 + C_0 C_1}\{(V_{RP} - V_{AP}) + V_\Delta\} \quad (12)$$

Because the output potential of Lower_DAC1$b$ has a constant value during sampling and voltage comparison by Upper_DAC1$a$, it is apparent that the voltage at the point N does not have an influence on comparison operation.

As apparent from expression (11), the A/D converter in FIG. 6 has the following features of e) to h).

e) The positive or negative state of the input potential difference of the comparator 2 is decided by the analog input voltage VAIN and voltages (VRP, VAP, VRN, and VAN) at the points PIN and NIN.
f) The input potential difference of the comparator 2 is decided by input differential mode components VRD and VAD, first and second capacitors C1 and C2, and first input attenuation capacitor C0.
g) Even if the P-side capacitor ratio C0/C1 of the comparator 2 is not equal to the N-side capacitor ratio C0/C2, this does not influence the positive or negative state of input potential difference.
h) Even when there is a difference between common mode component VAC of VAP and VAN and common mode component VRC of VRP and VRN, this does not influence the positive or negative state of input potential difference.

In the case of the A/D converter in FIG. 6, if a potential to be supplied to the connection node between the comparator 2 and a capacitor during sampling is kept in a certain range, the input voltage of the comparator 2 does not exceed the power-supply-voltage range similarly to the case of the A/D converter in FIG. 4 and it is possible to prevent overflow. The reason is described below by referring to FIGS. 7A and 7B. FIG. 7A is a circuit diagram when the third and fourth switches SW3 and SW4 are turned on and FIG. 7B is a circuit diagram when the third and fourth switches SW3 and SW4 are turned off.

When VAN=Lower_H, VRP=1.25 V, and VRN=Lower_H and the power-supply voltage ranges between 0 and 2.5 V, conditions in which the input of the comparator 2 does not overflow are shown by the following expressions (13) and (14).

$$0 \leq VP' \leq 2.5 \quad (13)$$

$$0 \leq VN' \leq 2.5 \quad (14)$$

Input voltages VP' and VN' of the comparator 2 are shown by the following expressions (15) and (16).

$$V'_N = -\frac{-C_0 C_1 + C_1 C_2 + C_2 C_0}{C_0 C_1 + C_1 C_2 + C_2 C_0}(V_{RD} - V_{AD}) - (V_{RC} - V_{AC}) + V_{CM} \quad (15)$$

$$V'_N = -\frac{-C_0 C_1 + C_1 C_2 + C_2 C_0}{C_0 C_1 + C_1 C_2 + C_2 C_0}(V_{RD} - V_{AD}) - (V_{RC} - V_{AC}) + V_{CM} \quad (16)$$

It is possible to derive the lower limit and upper limit of VCM when VAP=2.5 V and VAP=0 V by using expressions (13) to (16) and the following expressions (17) and (18) are obtained.

$V_{P'}$ side …

$$\frac{kC_1^2 - (k-1)C_0 C_1}{kC_1^2 + (k+1)C_0 C_1} \times 1.25 < V_{CM} < 2.5 - \frac{kC_1^2 - (k-1)C_0 C_1}{kC_1^2 + (k+1)C_0 C_1} \times 1.25 \quad (17)$$

$V_{N'}$ side …

$$\frac{kC_1^2 + (k-1)C_0 C_1}{kC_1^2 + (k+1)C_0 C_1} \times 1.25 < V_{CM} < 2.5 - \frac{kC_1^2 + (k-1)C_0 C_1}{kC_1^2 + (k+1)C_0 C_1} \times 1.25 \quad (18)$$

As shown in expressions (17) and (18), input voltages VP' and VN' of the comparator 2 do not exceed the power-supply-voltage range when the common-mode voltage VCM is kept in the range of expressions (17) and (18) even if the common-mode voltage VCM is deviated and it is possible to prevent overflow.

Thus, according to the third embodiment, by connecting the input attenuation capacitor C0 between the first and the second input terminals P and N of the comparator 2, it is possible to prevent overflow and moreover, there is a feature that the capacitance ratio between C0, C1, and C2 does not influence determination of a comparator in principle. That is, the third embodiment is superior in that the mismatching of capacitance values does not influence the accuracy of an A/D conversion compared to the case of the second embodiment. Moreover, it is also a feature that the difference between the common mode component VAC of VAP and VAN and the common mode component VRC of VRP and VRN does not influence the input potential difference of the comparator 2. Furthermore, because it is possible to decrease the number of resistors and the number of switches similarly to the case of the first and second embodiments, it is possible to decrease the circuit volume and layout area. Furthermore, it is possible to decrease the parasitic capacitance and to make fast the settling time of the output potential of the voltage generation circuit 1. Furthermore, by equalizing values of the capacitors C1 and C2, it is possible to prevent accuracy deterioration due to the parasitic capacitance similarly to the case of the first or second embodiment. Furthermore, by sufficiently increasing the capacitance value of C0 compared to a parasitic capacitance by considering a desired accuracy of an A/D converter, there is an advantage that it is possible to sufficiently decrease the influence of the parasitic capacitance.

Fourth Embodiment

Fourth embodiment is a full-differential A/D converter for A/D-converting the differential analog input voltage VAIN to output a digital signal.

FIG. 8 is a block diagram showing a schematic configuration of the A/D converter according to the fourth embodiment of the present invention. In FIG. 8, the same component as that in FIG. 1 is provided with the same reference numeral and different points are mainly described below.

As a differential analog input voltage, first and second analog input voltages VAIN_P and VAIN_N are input to the A/D converter in FIG. 8. In the case of the A/D converter in FIG. 8, the configuration of the voltage generation circuit 1 and arrangement of switches are different from the case of FIG. 1.

The voltage generation circuit 1 in FIG. 8 has first and second Upper_DAC1a and Upper_DAC1c and Lower_DAC1b. In FIG. 8, first Upper_DAC1a is referred to as Upper_DAC_P and second Upper_DAC1c is referred to as Upper_DAC_N.

Switches SW6 and SW7 are connected in series between an input terminal for inputting the first analog input voltage VAIN-P and an output terminal of Upper_DAC_P 1a. The capacitor C1 is connected between the connection node of these switches and the first input terminal P of the comparator 2. Switches SW8 and SW9 are connected in series between an input terminal for inputting the second analog input voltage VAIN_N and an output terminal of Upper_DAC_N 1c. The capacitor C2 is connected between the connection node of these switches and the second input terminal N of the comparator 2. Moreover, the capacitor C4 is connected between the output terminal of Lower DAC1b and the second input terminal N of the comparator 2.

Figure 9:
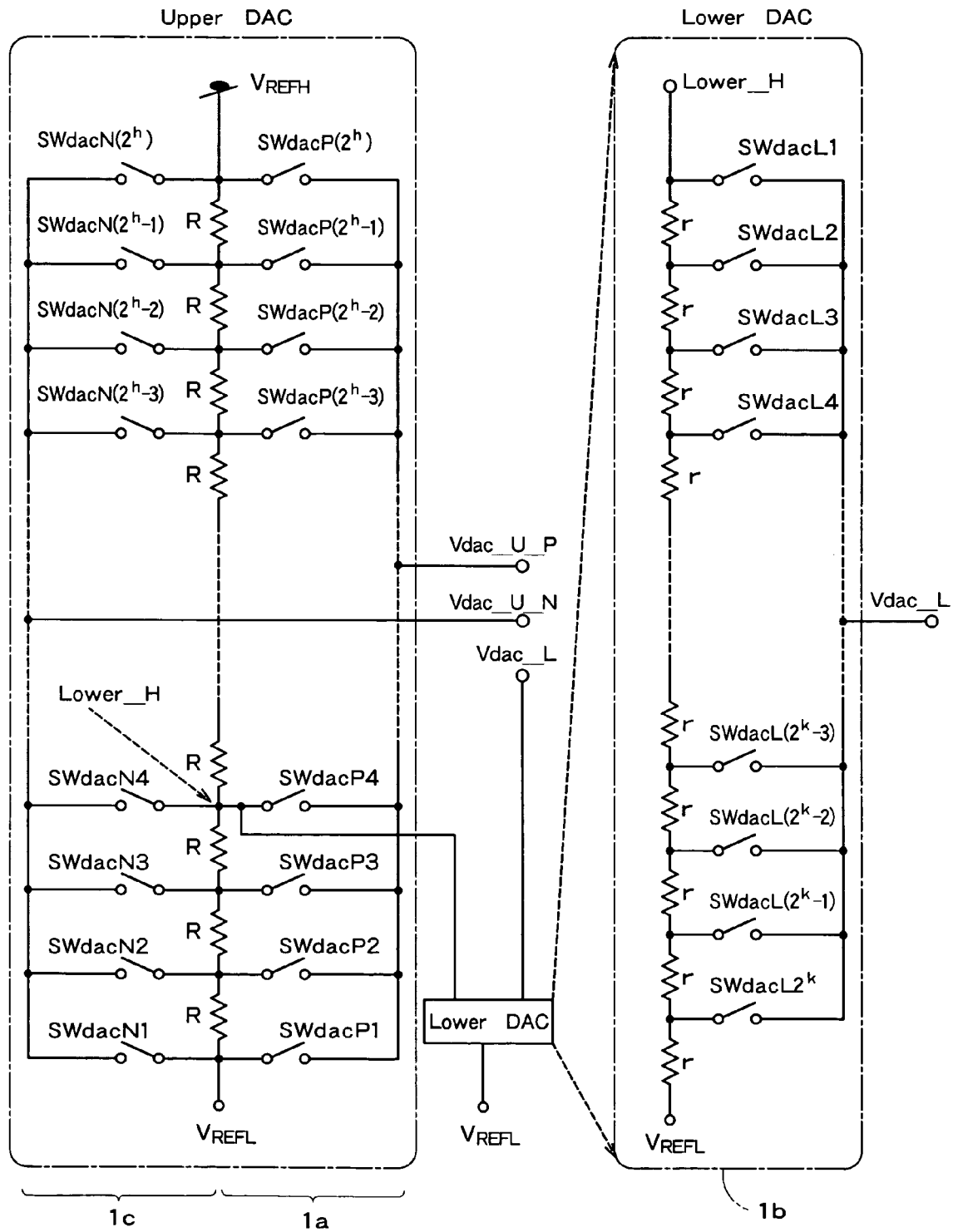
FIG. 9 is an illustration showing an internal configuration of a voltage generation circuit 1.

FIG. 9 is an illustration showing an example of an internal configuration of the voltage generation circuit 1. Though Upper_DAC_P 1a and Upper_DAC_N 1c share the same resistor string, they separately have switch strings SWdacP1 to SWdacP($2^h$), and SWdacN1 to SWdac N($2^h$). Each switch in these switch strings is connected to the connection node between resistors in the resistor string.

Though only one switch in each switch string is turned on, combination between a switch to be turned on in switch strings from SWdacP1 to SWdacP($2^h$) and a switch to be turned on in switch strings from SWdacN1 to SWdacN($2^h$) is previously decided. Thereby, Upper_DAC_P 1a and Upper_DAC_N 1c output differential voltages. In FIG. 9, the output voltage of Upper_DAC_P 1a is assumed as Vdac_U_P and the output voltage of Upper_DAC_N 1c is assumed as Vdac_U_N. For example, when assuming that the power-supply voltage ranges from 0 to 2.5 V and the output voltage of Upper_DAC_P 1a is Vdac_U_P=2 V, the output voltage of Upper_DAC_N 1c becomes Vdac_U_N=0.5 V. Upper_DAC_P 1a and Upper_DAC_N 1c output voltages whose voltage levels are mutually antithetical.

In FIG. 9, Upper_DAC_P 1a and Upper_DAC_N 1c share a resistor string constituted of a plurality of resistors, respectively. However, it is also allowed to connect a plurality of MOS transistors or various other impedance devices connected in series instead of resistors.

In the case of the A/D converter in FIG. 8, the number of resistors in the voltage generation circuit 1 is the same as the case of FIG. 2 and it is at least $\{(2^h-1)+2^k\}$. On the other hand, the number of switches in the voltage generation circuit 1 is greater than the case of FIG. 2 and it is ($2^{h+1}+2^k$).

Figure 10:
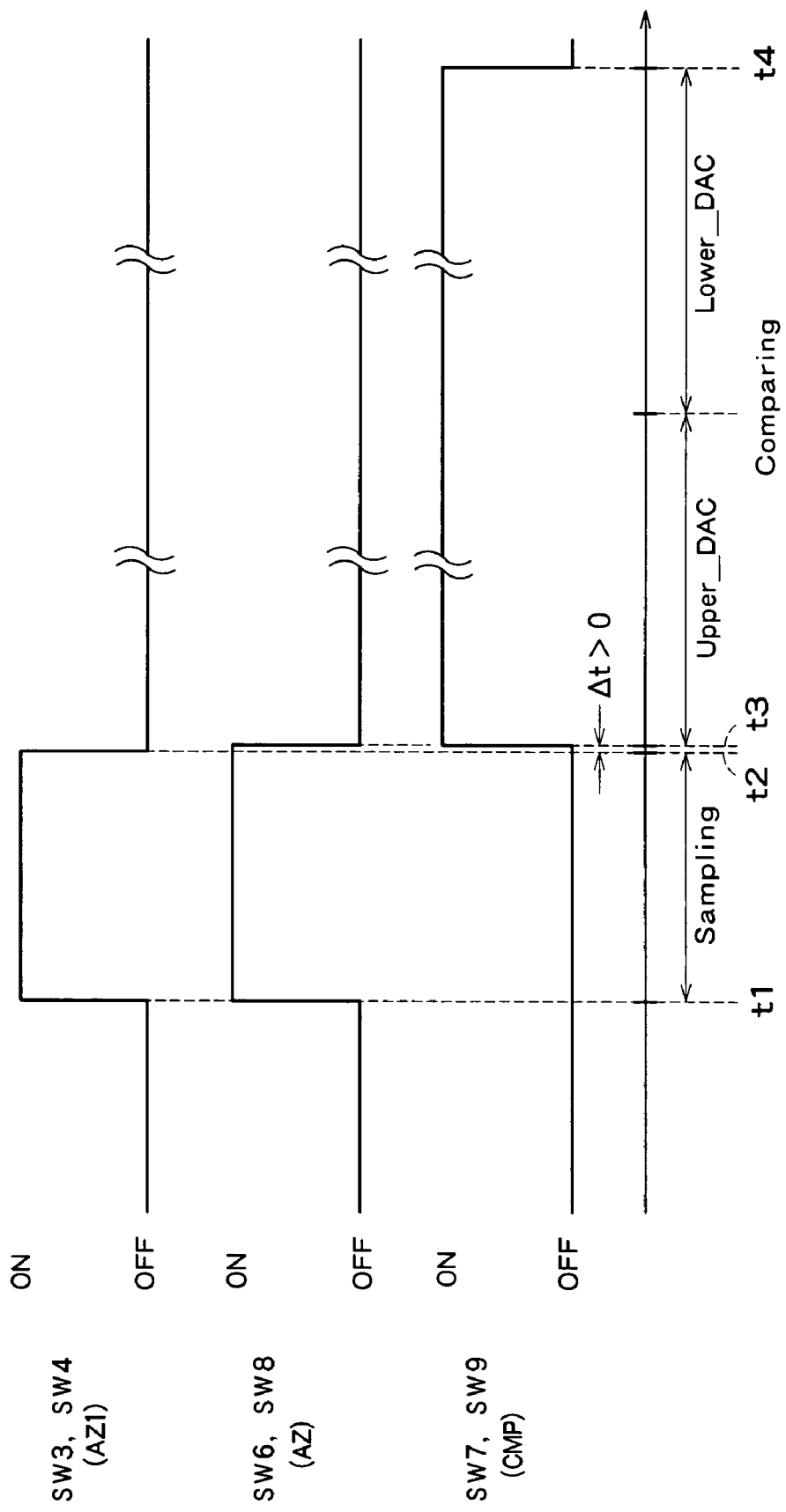
FIG. 10 is an operation timing diagram of the voltage generation circuit 1 in FIG. 8.

FIG. 10 is an operation timing chart of the voltage generation circuit 1 in FIG. 8. First, the period between times t1 and t2 is a sampling period and switches SW3, SW4, and SW6, and SW8 are turned on and SW7 and SW9 are turned off. During this period, the first and second input terminals P and N of the comparator 2 are set to the output common mode voltage VCM of the comparator 2 and electric charges Q1=C1 (VAIN_P−VCM) and Q2=C2 (VAIN_N−VCM) are accumulated in the first and second capacitors C1 and C2.

At the time t2, switches SW3 and SW4 are turned off. Immediately after that, switches SW7 and SW9 are turned on and the switches SW3, SW4, SW6, and SW8 are turned off in the period between the time t3 and the time t4. In this period, the voltages VP' and VN' at the points P and N are changed in accordance with the difference between output voltages of Upper_DAC_P 1a and Upper_DAC_N 1c and the difference with the differential analog input voltage (VAIN_P−VAIN_N). The A/D conversion control circuit 3 repeatedly changes output voltages of Upper_DAC_P 1a and Upper_DAC_N 1c so that the difference between output voltages of Upper_DAC_P 1a and Upper_DAC_N 1c approaches the differential analog input voltage (VAIN_P−VAIN_N). The number of repetitions of this processing depends on the numbers of bits of Upper_DAC_P 1a and Upper_DAC_N 1c.

After the time t4, adjustment corresponing to a differential analog input voltage is performed by sequentially changing the output voltage of Lower_DAC1b while keeping final output voltages of Upper_DAC_P 1a and Upper_DAC_N 1c.

The input voltage difference (VP'−VN') of the comparator 2 during voltage comparison by Upper_DAC1a is shown by the following expression (19). In this case, VAP is the potential at the point PIN during sampling, VAN is the potential at the point NIN during sampling, VRP is the potential at the point PIN during voltage comparison, and VRN is the potential at the point NIN at the time of voltage comparison.

$$V'_P - V'_N = \frac{C_1}{(C_0 + C_2 + C_4) \cdot (C_0 + C_1)} \times \qquad (19)$$
$$\{(C_2 + C_4) \cdot (V_{RP} - V_{AP}) - C_2 \cdot (V_{RN} - V_{AN})\}$$
$$= \frac{C_1}{C_1(C_2 + C_4) + C_0(C_2 + C_4) + C_0 C_1} \times$$
$$\{2 \cdot (C_2 + C_4)(V_{RD} - V_{AD}) + C_4 \cdot (V_{RC} - V_{AC})\}$$

The input potential difference (VP'−VN') of the comparator 2 during voltage comparison by Lower_DAC1b is shown by the following expression (20). Here, VAC shows the common mode component of differential analog input voltage, VAD shows the differential component of the differential analog input voltage, VRC0 shows the common mode component of decided values of Upper_DAC1a and Upper_DAC1c, VRD0 shows the differential mode component of decided values of Upper_DAC1a and Upper_DAC1c, and VL shows the difference between the voltage value during voltage comparison by Upper_DAC1a and Upper_DAC1c and the voltage value during voltage comparison by Lower_DAC1b for the voltage of Lower_DAC1b. Introduction processes of expressions (19) and (20) will be described later.

$$V'_P - V'_N = \frac{C_1}{(C_0 + C_2 + C_4) \cdot (C_0 + C_1) - C_0^2} \times \qquad (20)$$
$$\{(C_2 + C_4) \cdot (V_{RP0} - V_{AP}) - C_2 \cdot (V_{RN0} - V_{AN}) - C_4 \cdot V_L\}$$

In this case, when setting VAP=VAC+VAD, VAN=VAC−VAD, VRP0=VRC0+VRD0, and VRN0=VRC0−VRD0, realizing a differential format other than the output of Lower_DAC1$b$, and adjusting expression (20), expression (21) is obtained.

$$V'_P - V'_N = \frac{C_1}{C_1(C_2 + C_4) + C_0(C_2 + C_4) + C_0 C_1} \times \qquad (21)$$
$$\{(2C_2 + C_4) \cdot (V_{RD0} - V_{AD}) + C_4 \cdot (V_{RC} - V_{AC} - V_L)\}$$

Here, when setting C2=iC1 and C4=mC1, expression (22) is obtained.

$$V'_P - V'_N = \frac{C_1^2}{C_1^2 \cdot (i+m) + C_0 C_1 \cdot (1+i+m)} \cdot \qquad (22)$$
$$\{(2i+m) \cdot (V_{RD0} - V_{AD}) + m \cdot (V_{RC} - V_{AC} - V_L)\}$$
$$\left( = \frac{C_1^2}{C_1^2 \cdot (i+m) + C_0 C_1 \cdot (1+i+m)} \times \right.$$
$$\{(i+m) \cdot (V_{RP0} - V_{AP}) - i \cdot (V_{RN0} - V_{AN}) -$$
$$\left. m \cdot V_L\} \right)$$

As apparent from expression (22), the A/D converter in FIG. 8 has the following features i) to k).

i) In any result of Upper_DAC1$a$, only the difference between the output voltage of Lower_DAC1$b$ during the comparison by Upper_DAC1$a$ and Upper_DAC1$c$ and the output voltage of Lower_DAC1$b$ during the comparison by Lower_DAC1$c$ contributes to conversion.

j) When the common mode component of analog input voltages VAIN_P and VAIN_N is shifted from the common mode component of Upper_DAC1$a$ and Upper_DAC1$c$, this influences the positive or negative state of input potential difference.

k) Lower_DAC1$b$ divides {(2i+m)/m}LSB of Upper_DAC1$a$.

Thus, according to the fourth embodiment, the analog input voltage VAIN is inputted as a differential signal, noise tolerance property is excellent, and even if the amplitude of the analog input voltage VAIN is small, it is possible to precisely perform A/D converter. Moreover, the fourth embodiment has an advantage of preventing that the input potential of the comparator 2 overflows similarly to the case of the second and third embodiments. Furthermore, because the fourth embodiment can decrease the number of resistors and the number of switches similarly to the case of the first to third embodiments, it is possible to decrease a circuit volume and layout area.

Other Embodiments

Figure 11:
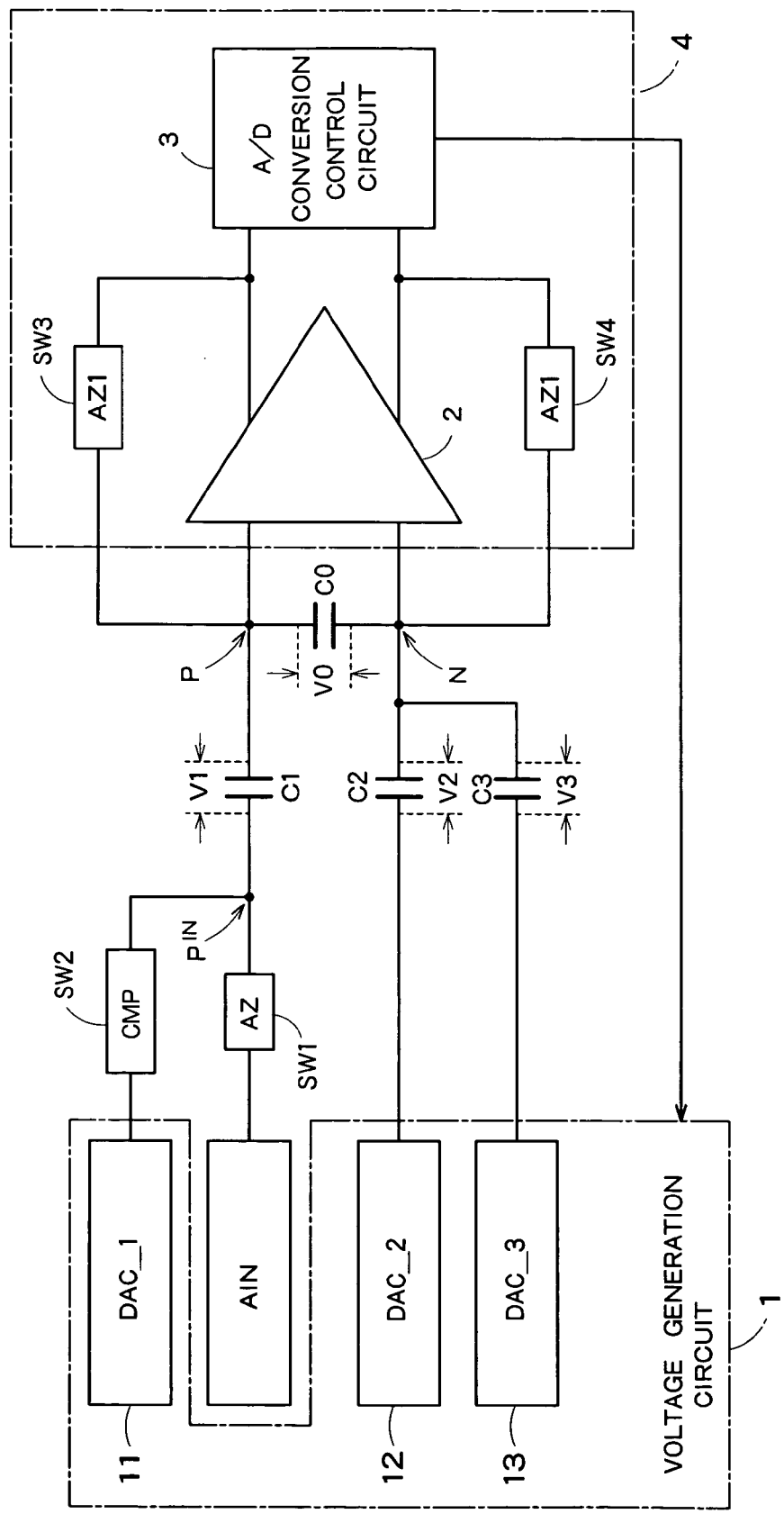
FIG. 11 is a block diagram showing an exemplary A/D converter obtained by dividing DAC into three parts.

In the case of the above-described first to fourth embodiments, DAC is divided into upper side portion and lower side portion to decrease the number of resistors and the number of switches. However, it is also allowed to divide the DAC into three or more portions. FIG. 11 is a block diagram showing one example of an A/D converter in which DAC is divided into three potions. The A/D converter in FIG. 11 has a DAC_1 11 to be connected to the point-P side and DAC_2 12 and DAC_3 13 to be connected to the point-N side. In FIG. 11, the switches SW1 and SW2 are connected in series between the output voltage of DAC_1 11 and the analog input voltage, and a first capacitor C1 is connected between the connection node between the switches SW1, SW2 and the first input terminal P. The second capacitor C2 is connected between the output terminal of DAC_2 12 and the second input terminal N of the comparator 2. The third capacitor C3 is connected between the output terminal of DAC_3 13 and the second input terminal N of the comparator 2. Moreover, though the input attenuation capacitor C0 is connected between the first and second input terminals P and N of the comparator 2, this capacitor is not indispensable configuration.

DAC_1 11, DAC_2 12, and DAC_3 13 respectively have a resistor string (or MOS transistor string) composed of a plurality of resistors connected in series and switches to be connected to the connection node of resistors similarly to the case in FIG. 2. The numbers of resistors of DAC_1 11, DAC_2 12, and DAC_3 13 are not restricted. However, resolutions of DACs depend on the number of resistors. For example, when assuming the accuracy of the A/D converter in FIG. 11 as x bits, resolution of DAC_1 11 as h bits, resolution of DAC_2 12 as i bit, and resolution of DAC_3 13 as j bits, it is necessary to satisfy the following expression x≦h+i+j.

In the case of the A/D converter in FIG. 11, switches SW1, SW3, and SW4 are turned on and the switch SW2 is turned off during sampling and the same operation as the case of the first embodiment is performed. Thereafter, the switch SW2 is turned on, switches SW1, SW3, and SW4 are turned off, and voltage comparison is started. First, the output voltage of DAC_1 11 and the analog input voltage VAIN are compared while making output voltages of DAC_2 12 and DAC_3 13 constant. Thereafter, while fixing the output voltage of DAC_1 11 to its final comparison voltage, the voltage of DAC_2 12 and analog input voltage VAIN are compared. Thereafter, while fixing output voltages of DAC_1 11 and DAC_2 12 to final comparison voltage, the voltage of DAC_3 13 and analog input voltage VAIN are compared.

FIG. 12 is a block diagram showing one example of an A/D converter in which DAC is divided into five portions. In the case of FIG. 12, DAC_P1 14 and DAC_P2 15 are arranged at the point-P side of the comparator 2 and DAC_N1 16, DAC_N2 17, and DAC_N3 18 are arranged at the point-N side. DAC_P1 14 is connected to a capacitor Cp1 through the switch SW2 and DAC_P2 15, DAC_N1 16, DAC_N2 17, and DAC_N3 18 are connected to corresponding capacitors Cp2, Cn1, Cn2, and Cn3.

Also in the case of the A/D converter in FIG. 12, when assuming the accuracy of the converter as x bits, resolution of DAC_P1 14 as h bits, resolution of DAC_P2 15 as i bits, resolution of DAC_N1 16 as j bits, resolution of DAC_N2 17 as k bits, and resolution of DAC_N3 18 as m bits, it is necessary to satisfy the following expression x≦h+i+j+k+m.

In FIG. 8, Upper_DAC1$a$ is divided into two portions in accordance with the differential analog input voltage VAIN to generate a differential voltage. However, it is also allowed to generate a differential voltage for Lower_DAC1$b$. FIG. 13 is a block diagram showing an exemplary A/D converter in which upper DAC and lower DAC generate differential voltage, respectively. Upper_DAC_P2 1 and Lower_DAC_P2 3, switches SW6 and SW7 to be connected in series between the first analog input voltage VAIN_P and Upper_DAC_P2 1, capacitor C1 to be connected between the connection node of these switches and the first input terminal P of the comparator 2, and capacitor CrP to be connected between Lower_DAC_P2 3 and the first input terminal P of the comparator 2 are arranged at the point-P side of the comparator 2. Upper_DAC_N2 2 and Lower_DAC_N2 4, switches SW8 and SW9 to be connected in series between the second analog input voltage VAIN_N and Upper_DAC_N2 2, capacitor C2 to be connected between the connection node of these switches and the second input terminal N of the comparator 2, and capacitor CrN to be connected between Lower_DAC_N2 4 and the second input terminal N of the comparator 2 are arranged at the point-N side of the comparator 2.

In FIG. 13, during sampling phase, the switches SW6 and SW8 are turned on and the switches SW7 and SW9 are turned off to charge the capacitors C1 and C2. Thereafter, voltage comparison is first performed between Upper_DAC_P2 1 and Upper_DAC_N2 2 and first and second analog input voltages VAIN_P and VAIN_N. In this period, Upper_DAC_P2 1 and Upper_DAC_N2 2 respectively output differential voltage and Lower_DAC_P2 3 and Lower_DAC_N2 4 respectively output a constant voltage. Thereafter, Lower_DAC_P2 3 and Lower_DAC_N2 4 on one hand and the first and second analog input voltages VAIN_P and VAIN_N on the other hand are compared while keeping output voltages of Upper_DAC_P2 1 and Upper_DAC_N2 4.

In the case of the A/D converter in FIG. 13, though the input attenuation capacitor C0 is connected between first and second input terminals P and N of the comparator 2, it is allowed to omit the capacitor. In this case, the circuit in FIG. 14 is realized. Moreover, it is allowed to separately connect the first and second input attenuation capacitors C3 and C4 to the point-P and point-N sides as shown in FIG. 15.

(Introduction Process of Expression of Input Potential Difference of Comparator 2)

Figure 16:
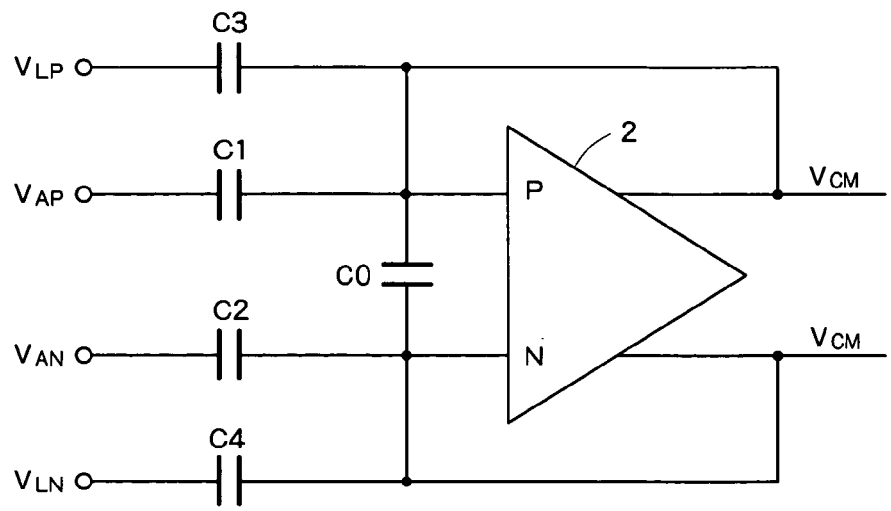
FIG. 16 is an equivalent circuit diagram around a comparator 2 currently sampled.

Hereafter, the introduction processes of expressions (3), (11), (19), and (20) are described below. FIG. 16 is an equivalent circuit around the comparator 2 during sampling. The equivalent circuit in FIG. 16 has the capacitor C0 to be connected between the first and second input terminals P and N of the comparator 2, capacitor C1 to be connected between the first input terminal P and the input voltage terminal VAP, capacitor C2 to be connected between the second input terminal N and the input voltage terminal VAN, capacitor C3 to be connected between the first input terminal P and the input voltage terminal VLP, and capacitor C4 to be connected between the second input terminal N and the input voltage terminal VLN.

Figure 17:
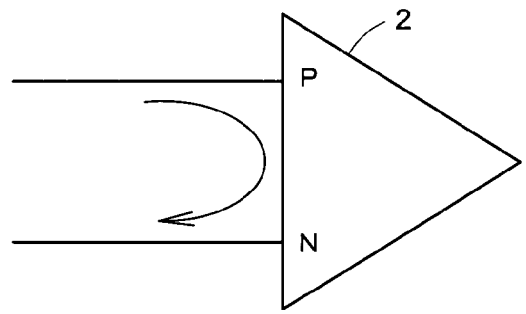
FIG. 17 is an illustration for explaining a voltage direction.

Here, a voltage direction is set in a direction in FIG. 17. In this case, accumulated electric charges Q0 to Q4 of the capacitors C0 to C4 are shown by the following expressions (23) to (27). VCM denotes the common mode voltage of the comparator 2.

$$Q0=0(=C0(VCM-VCM)) \tag{23}$$

$$Q1=C1(VAP-VCM) \tag{24}$$

$$Q2=C2(VCM-VAN) \tag{25}$$

$$Q3=C3(VLP-VCM) \tag{26}$$

$$Q4=C4(VCM-VLN) \tag{27}$$

Figure 18:
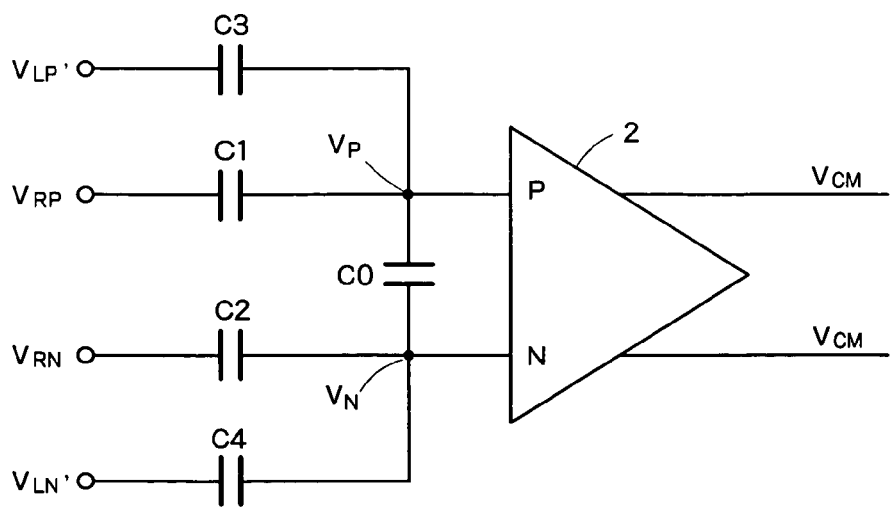
FIG. 18 is an equivalent circuit diagram around a comparator 2 while comparing voltages.

FIG. 18 is an equivalent circuit around the comparator 2 during voltage comparison. In FIG. 18, the input voltage of the capacitor C1 is assumed as VRP, the input voltage of the capacitor C2 is assumed as VRN, the input voltage of the capacitor C3 is assumed as VLP, and the input voltage of the capacitor C4 is assumed as VLN'.

Accumulated electric charges Q0' to Q4' of the capacitors C0 to C4 during voltage comparison are shown by the following expressions (28) to (32).

$$Q0'=C0(VP-VN) \tag{28}$$

$$Q1'=C1(VRP-VP) \tag{29}$$

$$Q2'=C2(VN-VRN) \tag{30}$$

$$Q3'=C3(VLP'-VP) \tag{31}$$

$$Q4'=C4(VN-VLN') \tag{32}$$

However, the following relations are effected.
VLP=VLP+V$\Delta$P, VLN'=VLN+V$\Delta$N In the case of each of the above-described embodiments, voltage comparison is performed by changing switches so that the electric charges accumulated in the capacitors C1 and C2 during sampling do not escape. Therefore, the law of conservation of electric charge is established. When considering the polarity of an electric charge, the law of conservation of electric charge is shown by the following expressions (33) and (34).

$$Q0-Q1-Q3=Q0'-Q1'-Q3' \tag{33}$$

$$-Q0-Q2+Q4=-Q0'+Q2'+Q4' \tag{34}$$

When arranging the expressions by substituting expressions (24) to (32) for expressions (33) and (34), the following expressions (35) and (36) are obtained.

$$C1(VRP-VAP+VCM)+C3(VLP'-VLP+VCM)=(C0+C1+C3)VP-C0VN \tag{35}$$

$$C2(VRN-VAP+VCM)+C4(VLN'-VLN+VCM)=-C0VP+(C0+C2+C4)\cdot VN \tag{36}$$

Here, setting [W]=VRP−VAP+VCM, [X]=VRN−VAN+VCM, [Y]=VLP'−VLP+VCM, and [Z]=VLN'−VLN+VCM, expressions (35) and (36) are shown by expressions (37) and (38).

$$C1[W]+C3[Y]=(C0+C1+C3)VP-C0VN \tag{37}$$

$$C2[X]+C4[Z]=-C0VP+(C0+C2+C4)VN \tag{38}$$

From these expressions (37) and (38), input voltages VP and VN of the comparator 2 are shown by expressions (39) and (40).

$$VP=\{C1(C0+C2+C4)[W]+C0C2[X]+C3(C0+C2+C4)[Y]+C0C4[Z]\}/\{(C0+C2+C4)(C0+C1+C3)-C0^2\} \tag{39}$$

$$VN=\{C0C1[W]+C2(C0+C1+C3)[X]+C0C3[Y]+C4(C0+C1+C3)[Z]\}/\{(C0+C2+C4)(C0+C1+C3)-C0^2\} \tag{40}$$

The output of the comparator 2 is decided in accordance with the magnitude of the input voltages VP and VN of the comparator 2. That is, the output of the comparator 2 is decided in accordance with the positive or negative state of (VP−VN). VP−VN is shown by expression (41) in accordance with expressions (39) and (40).

$$VP-VN=\{C1(C2+C4)[W]-C2(C1+C3)[X]+C3(C2+C4)[Y]-C4(C1+C3)[Z]\}/\{(C0+C2+C4)(C0+C1+C3)-C0^2\} \tag{41}$$

When returning [W], [X], [Y], and [Z] in expression (41) to original values, expression (42) is obtained.

$$VP-VN=\{(C1C2+C1C4)(VRP-VAP)-(C1C2+C2C3)(VRN-VAN+(C2C3+C3C4)(VLP'-VLP)-(C1C4+C3C4)(VLN'-VLN)\}/\{(C0+C2+C4)(C0+C1+C3)-C0^2\} \quad (42)$$

When setting C0=0 and VLP=VLP'=VLN=VLN' in expression (42), the above-described expression (3) is obtained.

Moreover, when setting C3=C4=0, and VLP=VLP'=VLN=VLN'=0, the above described expression (11) is obtained.

Moreover, when setting C3=0, VLP=VLP'=0, and VLN'−VLN=VL, the following expression (43) is obtained.

$$VP-VN=\{(C2+C4)\cdot(VRP-VAP)-C2(VRN-VAN)C4V2\}/\{(C0+C2+C4)(C0+C1)-C0^2\} \quad (43)$$

Because the output of Lower_DAC1$b$ is constant during voltage comparison of Upper_DAC1$a$ side, VL=0 is obtained. When substituting VL=0 for expression (43), expression (19) is obtained. Moreover, because the output voltage of Upper_DAC1$a$ is fixed on the final comparison value at the time of voltage comparison by Lower_DAC1$b$, expression (20) is obtained by substituting VRP=VRP0 and VRN=VRN0 for expression (43).

(Output Voltage Range of Lower_DAC1$b$ in Fourth Embodiment)

Lower_DAC1$b$ of any one of the first to third embodiments is connected to the both ends of any one of a plurality of resistors connected in series in Upper_DAC1$a$ in parallel. However, the Lower_DAC1$b$ of fourth embodiment has the reference voltage which is generated from both-end voltages of a resistor string constituted of two or more resistors in Upper_DAC1$a$, and the Lower_DAC1$b$ of fourth embodiment is connected in parallel between such a resistor strings. Hereafter, the output voltage range of Lower_DAC1$b$ is considered.

The capacitor in expression (42) is replaced as shown in expression (44).

$$C2=iC1,\ C3=mC1,\ C4=nC1 \quad (44)$$

The denominator of expression (42) is replaced with "A" as shown by expression (45).

$$A=1/\{(C0+C2+C4)(C0+C1+C3)-C0^2\} \quad (45)$$

When arranging expressions (44) and (45) by substituting them for expression (42), expression (46) is obtained.

$$VP-VN=A\cdot C1^2\{(i+n)(VRP-VAP)-(i+im)(VRN-VAN)+(im+mn)V\Delta P-(n+mn)V\Delta N \quad (46)$$

Because $A\cdot C1^2>0$, positive or negative state of (VP−VN) is decided by the value in braces of expression (46). When setting and arranging inside of { }=ΔPN, α=VRP−VAP, kα=VRN−VAN, and VΔP=γ·VΔN, expression (47) is obtained.

$$\Delta PN=\{(1-k)i-k\cdot im+n\}\alpha-\{n+(1-\gamma)mn-\gamma\cdot im\}\cdot V\Delta N \quad (47)$$

ΔPN shown by expression (47) is divided into the component depending on output values of Upper_DAC_P 1$a$ and Upper_DAC_N 1$c$ (hereafter referred to as upper side DAC) and the component depending on the output value of Lower_DAC1$b$. The components correspond to the first term and the second term of expression (47), respectively. In the present A/D converter, after A/D conversion with upper side DAC is completed, A/D conversion with Lower_DAC1$b$ in which the difference between the output signal of upper DAC and input signal is converted is executed to make ΔPN to be 1LSB of Lower_DAC1$b$ or less.

First, the range of the first term of expression (47) is considered when A/D conversion by upper side DAC is completed. When voltage comparison of Upper_DAC1$a$ is completed, |α|=|VRP−VAP| has 1LSB of Upper_DAC_P 1$a$ in maximum case. That is, when assuming 1LSB of Upper_DACP 1$a$ as VΔU, expression (48) is established.

$$\Delta\leq V\Delta U \quad (48)$$

Because Lower_DAC1$b$ outputs a constant value during sampling or voltage comparison using upper side DAC, VΔN is equal to 0. Therefore, when assuming ΔPN at the end of voltage comparison using upper side DAC as ΔPN_U, the following expression is obtained.

$$\Delta PN\_U=\{(1-k)i-k\cdot im+n\}\cdot\alpha$$

Therefore, when considering expression (48), the following expression (49) is obtained.

$$\Delta PN\_U\leq\{(1-k)i-k\cdot im+n\}\cdot V\Delta U \quad (49)$$

Then, when assuming the component depending on the output value of Lower_DAC1$b$ in ΔPN as β, expression (50) is obtained because β is the second term of expression (47).

$$\beta=\{n+(1-\gamma)\cdot mn-\gamma\cdot im\}\cdot V\Delta N \quad (50)$$

Because the range of β must be equal to the range of ΔPN_U, β has to satisfy expression (51) in accordance with expression (49).

$$\beta\leq\{(1-k)i-kim+n\}V\Delta U \quad (51)$$

Because it is necessary that the range of VΔN which is a change of the output of Lower_DAC1$b$ is decided with β satisfying expression (51), the range of VΔN is shown by expression (52) which is derived from (50) and (51).

$$V\Delta N\leq\{(1-k)i-kim+n\}V\Delta U/\{n+(1-\gamma)mn-\gamma im\} \quad (52)$$

Therefore, it is necessary to set the output voltage range of Lower_DAC1$b$ to {(1−k)i−kim+n}/{n+(1−γ)mn−γim} times of 1LSB of Upper_DAC_P 1$a$.

(Type and Operations of Comparator 2)

In FIGS. 1, 4, 6, and 8 and FIGS. 11 to 15, the differential-output comparator 2 is used. However, it is allowed to use a single-ended output comparator 2. In this case, the A/D converting portion 4 around the comparator 2 is shown in FIG. 19.

Switching circuits SW10 and SW11 are connected to the input terminals p and n of the comparator 2$a$ in FIG. 19 instead of the third and fourth switching circuits SW3 and SW4 in FIG. 1. These switching circuits SW10 and SW11 are turned on during sampling and turned off during comparison.

When using the comparator 2 having the differential output same as the case of FIGS. 1, 4, 6, and 8 and FIGS. 11 to 15, it is allowed to set the switching circuits SW10 and SW11 same as the case of FIG. 19 instead of the third and fourth switching circuits SW3 and SW4. In this case, the A/D converting portion 4 around the comparator 2 is shown in FIG. 20.

Moreover, in FIGS. 1, 4, 6, 8 and FIGS. 11 to 15, it is allowed to connect only one of output terminals of the differential-output comparator 2 to the A/D conversion control circuit 3. In this case, the A/D converting portion 4 around the comparator 2 is shown in FIG. 21.

What is claimed is:

1. An A/D (analog-to-digital) converter, comprising:
a first voltage generation circuit configured to generate a first output voltage;
a second voltage generation circuit configured to generate a second output voltage;
a comparator which has first and second input terminals and a first output terminal, and outputs from the first output terminal a signal in accordance with a potential difference between the first and second input terminals;
first and second switch circuits connected in series between an input terminal of an analog input voltage and an output terminal of the first voltage generation circuit;
a first capacitor inserted between a connection node between the first and second switch circuits and the first input terminal;
a second capacitor inserted between an output terminal of the second voltage generation circuit and the second input terminal;
a third switch circuit, one end of which is connected to the first input terminal, and which can set the first input terminal to an output common mode voltage or a predetermined voltage at conductive time;
a fourth switch circuit, one end of which is connected to the second input terminal, and which can set the second input terminal to the output common mode voltage or the predetermined voltage at conductive time;
an A/D conversion control circuit which generates a digital signal in accordance with signal level of the first output terminal; and
a voltage setting circuit which sets voltages to be outputted from the first and second voltage generation circuits based on the digital signal,
wherein the first to fourth switch circuit switch ON/OFF in an initial period for sampling the analog input voltage, a first period for gradually changing the first output voltage and comparing the first output voltage with the analog input voltage after the initial period, and a second period for gradually changing the second output voltage and comparing the second output voltage with the analog input voltage and
wherein the second voltage generation circuit generates the second output voltage having a maximum voltage level capable of being outputted by the second voltage generation circuit during the initial period and the first period, and gradually changes the second output voltage by using a final first output voltage without changing a value thereof.

2. The A/D converter according to claim 1,
wherein during the first period, the first, third and fourth switch circuits are set to conductive state, the second switch circuit is set to cutoff state, and the output voltage of the second voltage generation circuit is set to a first initial voltage;
during the second period after the first period, the second switch circuit is set to conductive state, and the first, third and fourth switch circuits are set to cutoff state; and
the voltage setting circuit performs feedback control in which a voltage obtained by adding a voltage difference between the first initial voltage and the output voltage of the second voltage generation circuit to the output voltage of the first voltage generation circuit approaches the analog input voltage during the second period.

3. The A/D converter according to claim 2,
wherein the voltage setting circuit sequentially changes the output voltage of the first voltage generation circuit at a state of setting the output voltage of the second voltage generation circuit to the first initial voltage during the second period; and
when the output voltage of the first voltage generation circuit is the nearest to the analog input voltage and smaller than the analog input voltage, the voltage setting circuit sequentially changes the output voltage of the second voltage generation circuit.

4. The A/D converter according to claim 1, further comprising:
a first input attenuation capacitor connected between the first input terminal and a fifth reference voltage terminal; and
a second input attenuation capacitor connected between the second input terminal and a sixth reference voltage terminal.

5. The A/D converter according to claim 1,
wherein the comparator has a second output terminal which outputs a differential signal besides the first output terminal;
the third switch circuit is inserted between the first input terminal and the first output terminal; and
the fourth switch circuit is inserted between the second input terminal and the second output terminal.

6. The A/D converter according to claim 1,
wherein the third switch is inserted between the first input terminal and a reference voltage terminal; and
the fourth switch is inserted between the second input terminal and the reference voltage terminal.

7. The A/D converter according to claim 1,
wherein a voltage range outputted from the second voltage generation circuit is a voltage range corresponding to one LSB voltage of the voltage outputted from the first voltage generation circuit; and
the second voltage generation circuit outputs a plurality of voltages obtained by dividing the voltage corresponding to one LSB voltage outputted from the first voltage generation circuit.

8. The A/D converter according to claim 1,
wherein the first voltage generation circuit includes:
a plurality of impedance elements connected in series; and
a plurality of first voltage generation switch circuits, one end of which is connected to a connection node between the plurality of impedance elements, and the other end of which is connected to the output terminal of the first voltage generation circuit,
wherein the second voltage generation circuit includes:
a plurality of impedance elements connected in series; and
a plurality of second voltage generation switch circuits, one end of which is connected to a connection node between the plurality of impedance elements, and the other end of which is connected to the output terminal of the second voltage generation circuit,
wherein the voltage setting circuit turns on one of the plurality of first voltage generation switch circuits and turns on one of the plurality of second voltage generation switch circuits based on the digital signal.

9. The A/D converter according to claim 8,
wherein when the first voltage generation circuit outputs digital data of h bits (h is positive integer) and the second voltage generation circuit outputs digital data of k bits (k is positive integer), a minimum value of total number of the impedance elements in the first and second voltage generation circuits is $(2^h-1+2^k)$, and a minimum value of a total number of the first and second voltage generation switch circuits is $(2^h-1+2^k)$.

10. An A/D (analog-to-digital) converter, comprising:
a first voltage generation circuit;
a second voltage generation circuit;
a comparator which has first and second input terminals and a first output terminal, and outputs from the first output terminal a signal in accordance with a potential difference between the first and second input terminals;
first and second switch circuits connected in series between an input terminal of an analog input voltage and an output terminal of the first voltage generation circuit;
a first capacitor inserted between a connection node, the connection node between the first and second switch circuits, and the first input terminal;
a second capacitor inserted between an output terminal of the second voltage generation circuit and the second input terminal;
a third switch circuit, one end of which is connected to the first input terminal, and which can set the first input terminal to an output common mode voltage or a predetermined voltage at conductive time;
a fourth switch circuit, one end of which is connected to the second input terminal and which can set the second input terminal to the output common mode voltage or the predetermined voltage at conductive time;
an A/D conversion control circuit which generates a digital signal in accordance with signal level of the first output terminal;
a voltage setting circuit which sets voltages to be outputted from the first and second voltage generation circuits based on the digital signal; and
an input attenuation capacitor connected between the first and second input terminals.

11. An A/D (analog-to-digital) converter, comprising:
a first voltage generation circuit which generates a voltage between first and second reference voltages;
a second voltage generation circuit which generates a voltage between third and fourth reference voltages;
a third voltage generation circuit which outputs a voltage having a polarity opposite to that of the output voltage of the first voltage generation circuit based on an intermediate voltage between the first and second reference voltages;
a comparator which has first and second input terminals and a first output terminal, and outputs from the first output terminal a voltage in accordance with a potential difference between the first and second input terminals;
first and second switch circuits connected in series between an input terminal of a first analog input voltage serving as one of an analog differential input voltage and an output terminal of the first voltage generation circuit;
third and fourth switch circuits connected in series between an input terminal of a second analog input voltage serving as the other of the analog differential input voltage and an output terminal of the third voltage generation circuit;
a first capacitor inserted between a connection node between the first and second switch circuits and the first input terminal;
a second capacitor inserted between a connection node between the third and fourth switch circuits and the second input terminal;
a third capacitor inserted between an output terminal of the second voltage generation circuit and the second input terminal;
a fifth switch circuit, one end of which is connected to the first input terminal and which can set the first input terminal to an output common mode voltage or a predetermined voltage at conductive time;
a sixth switch circuit, one end of which is connected to the second input terminal and which can set the second input terminal to an output common mode voltage or a predetermined voltage at conductive time;
an A/D conversion control circuit which generates a digital signal in accordance with signal level of the first output terminal; and
a voltage setting circuit which sets voltages to be outputted from the first, second and third voltage generation circuits based on the digital signal.

12. The A/D converter according to claim 11,
wherein during a first period, the first, third and fourth switch circuits are set to conductive state, the second switch circuit is set to cutoff state, and the output voltage of the second voltage generation circuit is set to a first initial voltage;
during a second period after the first period, the second switch circuit is set to conductive state, and the first, third and fourth switch circuits are set to cutoff state; and
the voltage setting circuit performs feedback control in which a voltage obtained by adding a voltage difference between the first initial voltage and the output voltage of the second voltage generation circuit to the output voltage of the first voltage generation circuit approaches the analog input voltage during the second period.

13. The A/D converter according to claim 12,
wherein the voltage setting circuit sequentially changes the output voltage of the first voltage generation circuit at a state of setting the output voltage of the second voltage generation circuit to the first initial voltage during the second period; and
when the output voltage of the first voltage generation circuit is the nearest to the analog input voltage and smaller than the analog input voltage, the voltage setting circuit sequentially changes the output voltage of the second voltage generation circuit.

14. The A/D converter according to claim 11, further comprising:
a first input attenuation capacitor connected between the first input terminal and a fifth reference voltage terminal; and
a second input attenuation capacitor connected between the second input terminal and a sixth reference voltage terminal.

15. The A/D converter according to claim 11, further comprising: an input attenuation capacitor connected between the first and second input terminals.

16. The A/D converter according to claim 11,
wherein the comparator has a second output terminal which outputs a differential signal besides the first output terminal;
the third switch circuit is inserted between the first input terminal and the first output terminal; and
the fourth switch circuit is inserted between the second input terminal and the second output terminal.

17. The A/D converter according to claim 11,
wherein the third switch is inserted between the first input terminal and a reference voltage terminal; and the fourth switch is inserted between the second input terminal and the reference voltage terminal.

18. The A/D converter according to claim 11, wherein a voltage range outputted from the second voltage generation circuit is a voltage range corresponding to one LSB voltage of the voltage outputted from the first voltage generation circuit; and the second voltage generation circuit outputs a plurality of voltages obtained by dividing the voltage for one LSB outputted from the first voltage generation circuit.

19. The A/D converter according to claim 11, wherein the first voltage generation circuit includes:

a plurality of impedance elements connected in series; and a plurality of first voltage generation switch circuits, one end of which is connected to a connection node between the plurality of impedance elements, and the other end of which is connected to the output terminal of the first voltage generation circuit, wherein the second voltage generation circuit includes:

a plurality of impedance elements connected in series; and a plurality of second voltage generation switch circuits, one end of which is connected between the plurality of impedance elements, and the other end of which is connected to the output terminal of the second voltage generation circuit, wherein the voltage setting circuit turns on one of the plurality of first voltage generation switch circuits and turns on one of the plurality of second voltage generation switch circuits based on the digital signal.

20. The A/D converter according to claim 19, wherein when the first voltage generation circuit outputs digital data of h bits (h is positive integer) and the second voltage generation circuit outputs digital data of k bits (k is positive integer), a minimum value of total number of the impedance elements in the first and second voltage generation circuits is $(2^h-1+2^k)$ and a minimum value of a total number of total number of the first and second voltage generation switch circuits is $(2^h-1+2^k)$.

* * * * *